(12) United States Patent
Ishibashi et al.

(10) Patent No.: US 7,847,756 B2
(45) Date of Patent: Dec. 7, 2010

(54) THREE-DIMENSIONAL IMAGE DISPLAY APPARATUS INCLUDING A ROTATING TWO-DIMENSIONAL DISPLAY PANEL

(75) Inventors: Yoshihito Ishibashi, Tokyo (JP); Masayuki Takada, Tokyo (JP); Shinya Saito, Tokyo (JP)

(73) Assignee: Sony Corporation, Tokyo (JP)

( * ) Notice: Subject to any disclaimer, the term of this patent is extended or adjusted under 35 U.S.C. 154(b) by 1519 days.

(21) Appl. No.: 10/884,958

(22) Filed: Jul. 7, 2004

(65) Prior Publication Data

US 2005/0035962 A1    Feb. 17, 2005

(30) Foreign Application Priority Data

| | | |
|---|---|---|
| Jul. 9, 2003 | (JP) | 2003-272384 |
| Jul. 14, 2003 | (JP) | 2003-273871 |
| Jul. 16, 2003 | (JP) | 2003-275225 |
| Jul. 24, 2003 | (JP) | 2003-278752 |
| Aug. 1, 2003 | (JP) | 2003-284675 |

(51) Int. Cl.
    *G09G 3/00* (2006.01)
(52) U.S. Cl. .................. 345/31; 345/111
(58) Field of Classification Search ........... 345/1.1–2.3, 345/108–111, 6, 31; 40/544; 382/154; 340/815.62
See application file for complete search history.

(56) References Cited

U.S. PATENT DOCUMENTS

| | | | | |
|---|---|---|---|---|
| 3,154,636 | A * | 10/1964 | Schwertz | 348/51 |
| 4,160,973 | A * | 7/1979 | Berlin, Jr. | 345/31 |
| 4,318,098 | A * | 3/1982 | McGreevy | 345/111 |
| 5,703,961 | A * | 12/1997 | Rogina et al. | 382/154 |
| 6,069,593 | A * | 5/2000 | Lebby et al. | 345/1.1 |
| 6,487,020 | B1 * | 11/2002 | Favalora | 359/619 |
| 6,801,185 | B2 * | 10/2004 | Salley | 345/102 |
| 6,998,772 | B2 * | 2/2006 | Terumoto | 313/504 |
| 2003/0038762 | A1 * | 2/2003 | Leja | 345/82 |
| 2003/0222869 | A1 * | 12/2003 | Yoshino | 345/419 |

FOREIGN PATENT DOCUMENTS

| | | |
|---|---|---|
| JP | 56-500313 | 3/1981 |
| JP | 2-120788 | 5/1990 |

(Continued)

*Primary Examiner*—Chanh Nguyen
*Assistant Examiner*—Allison Walthall
(74) *Attorney, Agent, or Firm*—Oblon, Spivak, McClelland, Maier & Neustadt, L.L.P.

(57) ABSTRACT

A three-dimensional image display apparatus which displays a three-dimensional image as a set of two-dimensional images by switching and displaying the two-dimensional images on a rotating self-luminous two-dimensional display panel while synchronizing with the rotation angle of the two-dimensional display panel. This three-dimensional image display apparatus comprises a rotation body for rotating the two-dimensional display panel while fixing and supporting, a support body for rotatably supporting the rotation body, compressing image data on the support body to display the two-dimensional image on the two-dimensional display panel, transmitting the compressed image data from the support body to the rotation body side, receiving the transmitted compression image data on the rotation body, and expanding the received compression image data on the rotation body so as to restore an original image data. The support body is external to the rotation body, and includes drive coils which generate a repulsive and an attractive force with magnets in the rotation body.

15 Claims, 25 Drawing Sheets

FOREIGN PATENT DOCUMENTS

| | | |
|---|---|---|
| JP | 4-241594 | 8/1992 |
| JP | 9-115085 | 5/1997 |
| JP | 10-112854 | 4/1998 |
| JP | 10-304403 | 11/1998 |
| JP | 2000-252144 A | 9/2000 |
| JP | 2002-132241 A | 5/2002 |
| JP | 2003-161911 A | 6/2003 |
| WO | WO 01/80204 A2 | 10/2001 |
| WO | WO 03/053109 A1 | 6/2003 |
| WO | WO 2008/002218 A1 | 1/2008 |

* cited by examiner

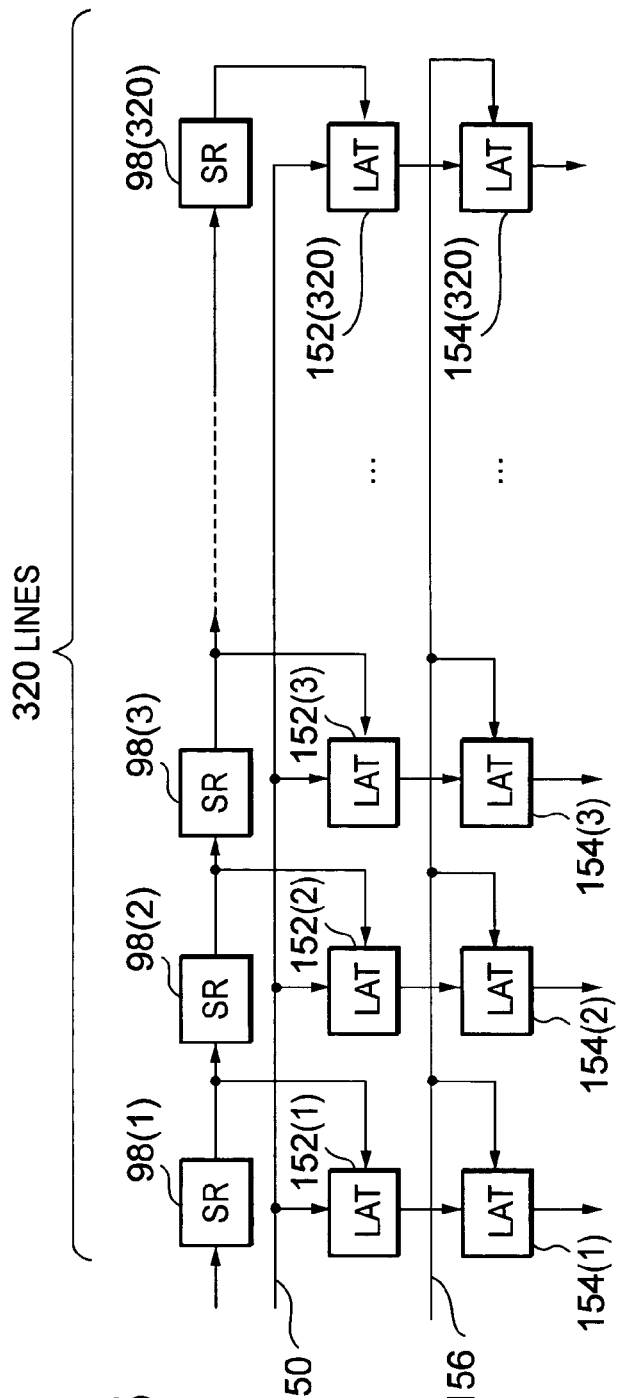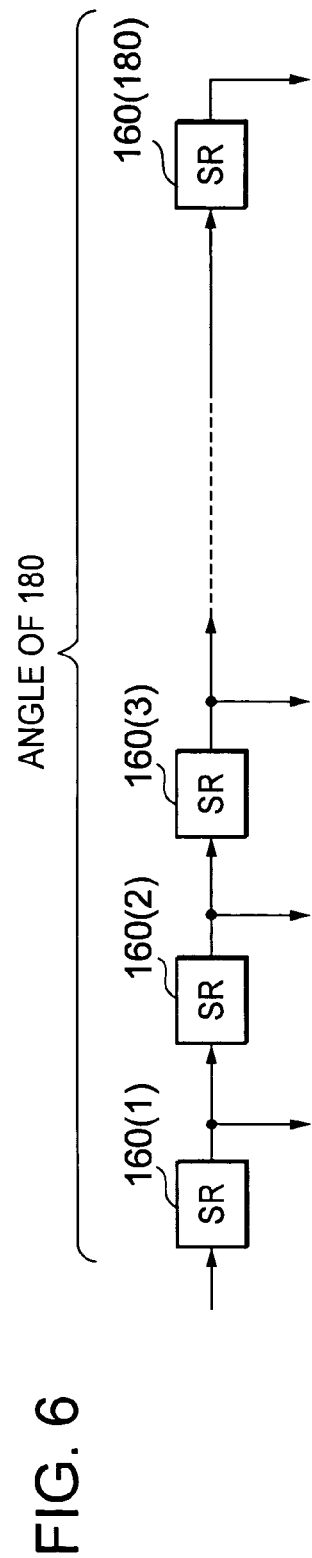
FIG. 5
FIG. 6

FIG. 10A  FIG. 10B  FIG. 10C
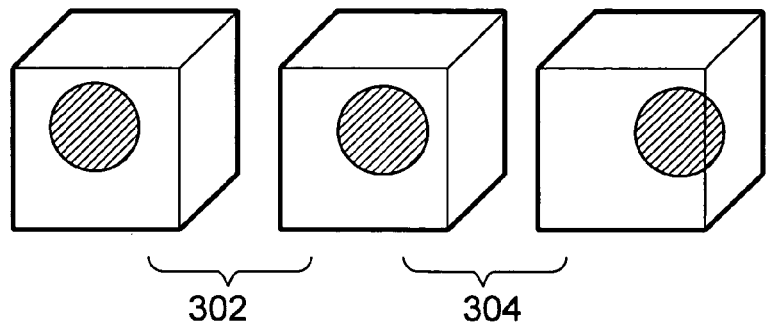
FIG. 11A  FIG. 11B
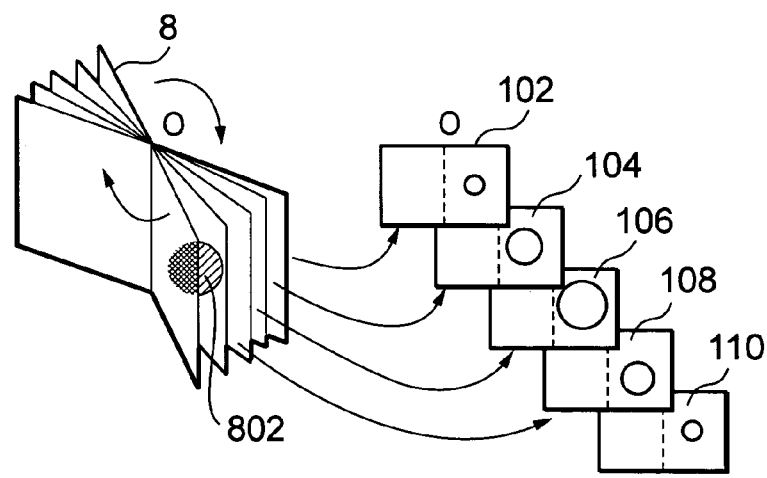
FIG. 12
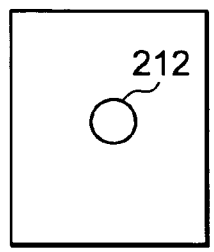
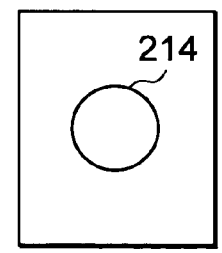
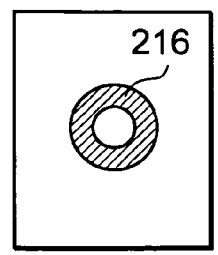

FIG. 13

FIG. 33A  BACKGROUND ART
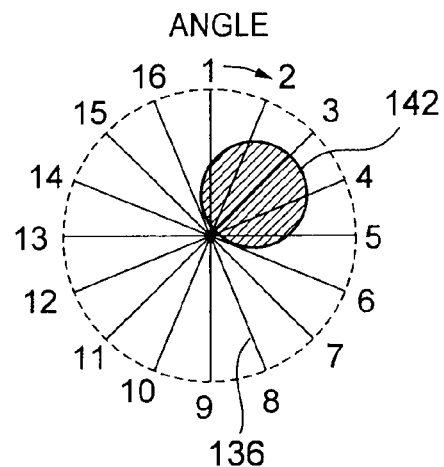
FIG. 33B
BACKGROUND ART
FIG. 33C
BACKGROUND ART
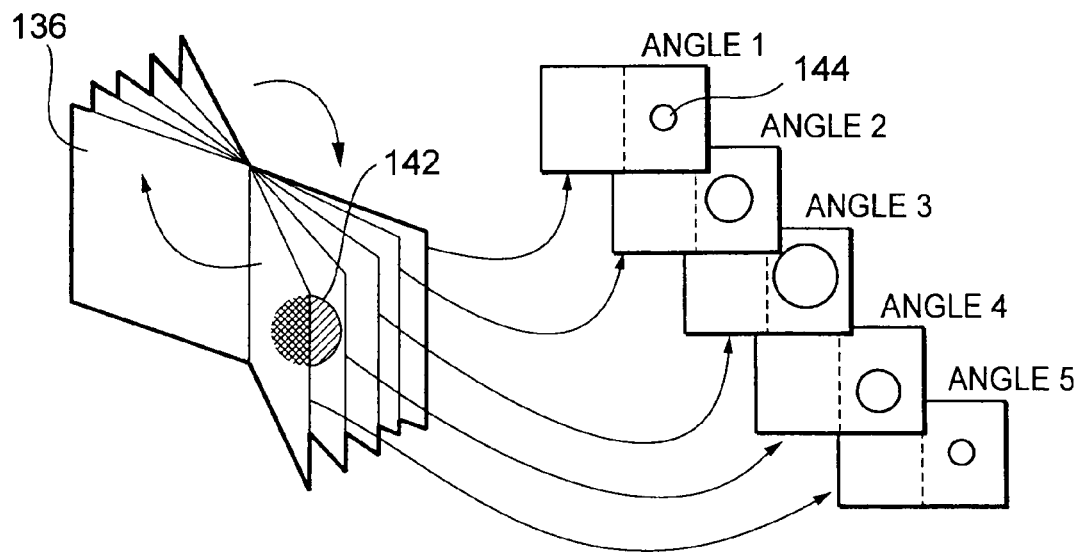

THREE-DIMENSIONAL IMAGE DISPLAY APPARATUS INCLUDING A ROTATING TWO-DIMENSIONAL DISPLAY PANEL

BACKGROUND OF THE INVENTION

1. Field of the Invention

The present invention relates to a three-dimensional image display apparatus which synchronizes with a rotation angle of a rotating two-dimensional display device so as to display a three-dimensional image by switching and displaying an image on the two-dimensional display device.

2. Description of the Related Art

It is desired that a three-dimensional image display apparatus for displaying a three-dimensional image (which may be referred to as a three-dimensional display unit) should be realized in a lot of application fields, such as a medical filed, a chemical field (molecule structural analysis), a machine design filed (CAD), an advertising display filed, and an entertainment field.

Consequently, as a three-dimensional display unit, a system using binocular parallax is put into practical use. For example, a 50-inch type three-dimensional display unit having four viewpoints is presented, and a mobile telephone incorporating a three-dimensional display function is put into practical use.

Although it is possible for these three-dimensional display units which use the binocular parallax to display a three-dimensional image comparatively easily by means of a flat display unit, a viewpoint position allowing stereoscopic vision is limited, so that a viewer cannot observe an image from an arbitrary position.

As the result, a system with which the viewer can observe a three-dimensional image from an arbitrary position, a volumetric scan type three-dimensional display unit is known and put into practical use as a product.

FIG. 32 is a view showing a schematic structure of this volumetric scan type three-dimensional display unit. A three-dimensional display unit 132 comprises a base unit 134, a screen 136 rotating at a high speed revolution (730 rpm) on the base unit 134, and a windshield 138 for housing the screen 136. The base unit 134 has therein an optical system constituting a projector which projects an image on the rotating screen 136 by means of a DMD (Digital Micro-mirror Device), and its projection mirror section 140 is provided on an upper surface of the base unit 134. By synchronizing with a rotation angle of the screen 136, this projection function performs switching and projecting a cross-sectional image of a three-dimensional object on the screen 136.

Now, a principle which performs display of the three-dimensional image by means of the above-mentioned volumetric scan type three-dimensional display unit will be described by using FIG. 15. It is assumed that a certain spherical three-dimensional object 142 is displayed as shown in FIG. 33A. It is further assumed that a surface cutting image, namely, a surface sectional image of this three-dimensional object 142 is considered in the situation where the screen 136 is rotating continuously and the screen 136 is at a certain rotation angle.

As shown in FIG. 33B, at the time of an angle (rotation angle) of 1, the screen 136 is in the position where the screen 136 slightly enters the three-dimensional object 142, whose surface cutting image (hereinafter referred to as a cross-sectional image) is a small circle 144 in the beginning as shown at an angle of 1 in FIG. 33C. Similar to the above description, as the screen 136 enters the three-dimensional object 142, a size of the cross-sectional image changes. The size of the circle 144 is the maximum at an angle of 3. Then, at an angle of 5, it becomes smaller. Finally, the screen 136 disengages from the three-dimensional object 142.

In this way, for each angle of the screen 136, a cross-sectional image of the three-dimensional object as shown in FIG. 33C is projected and displayed on the screen 136 through the projection mirror section 140. When the screen 136 is rotating at a high revolution speed at this time, an integral effect in an eye causes the screen 136 to be invisible and all the displayed cross-sectional images to be visible as a residual image, so that a three-dimensional image of the three-dimensional object 142 is displayed as a set of the continuous cross-sectional images. In order to obtain this effect effectively, a volume rewriting cycle is desirably 30 Hz or more (although there are some flickers at a lower cycle, it is possible to display a three-dimensional image). Therefore, the number of revolutions of the screen 136 is desirably 15 Hz (900 rpm) or more.

However, in order to display an image on the rotating screen 136 by using a projector, it is necessary to reflect a video image on the mirrors by a plurality of times. Therefore, in order to display the image with sufficient accuracy, it is necessary to precisely establish a complicated reflective system by means of the mirrors, this increases a cost of the device. First of all, it is difficult to improve a display accuracy, thus only a fuzzy three-dimensional image is obtained. Moreover, there is a problem that it is also difficult to get higher brightness and contrast of the three-dimensional image.

A method of solving the problem of such a three-dimensional display unit may be a system in which an image is switched and directly displayed on the rotating self-luminous two-dimensional display device (the same as the two-dimensional display panel) while synchronizing with the rotation angle thereof, without using a projector. This system performs clearly displaying of a three-dimensional image, and improving the display accuracy, the brightness and the contrast. A basic idea of such a system is known (for example, see Patent Document 1).

Patent Document 1: International Publication No. S56-500313 (Japanese Translation of PCT International Application)

SUMMARY OF THE INVENTION

However, in the conventional system where the image is switched and displayed on the rotating self-luminous two-dimensional display device, By synchronizing with the rotation angle thereof, the following conditions are necessary as the self-luminous two-dimensional display device.

(1) High-speed refresh rate. For example, assuming that the volume rewriting cycle is 30 Hz, and an angular resolution is 2 degrees (180 per round), a rewriting cycle for one screen image in the self-luminous two-dimensional display device becomes 30 Hz×180=4800 Hz.

(2) High definition, high brightness, and high contrast which are fundamental properties as a display.

(3) A viewing angle should be large. A small viewing angle does not allow a displayed image to be seen when a display device is viewed slantingly, so that the image is not visible as a three-dimensional image.

(4) It should be thin. If a display device is thick, the image is not displayed on the thick portion, and this causes an uncomfortable three-dimensional image.

(5) Double-sided emission at the front surface and the back surface.

However, in the above-mentioned known example, an example of a self-luminous display is described to use a panel where LED's are arranged in two dimensions. Until now, there is not such panel having arranged LED's in two dimensions that fulfill the above conditions. Therefore, even if the self-luminous two-dimensional display device which rotates by using the LED panel is constructed, this LED panel only results a poor angular resolution and thus the LED panel can only display a three-dimensional image with bad flickering and a coarse resolution. For this reason, even if a two-dimensional cross-sectional image is displayed on the rotating LED panel while synchronizing with its rotation angle, it is impossible to display a three-dimensional image with a regular and practical use level.

Further, two-dimensional image data required to be transmitted to the rotating self-luminous two-dimensional display device side. If a wired transmission system which comprises a transmission line wired to a rotating rotation shaft rotating two-dimensional display device, and a fixed conductor board which slides on this transmission line is used, there is a problem with durability or reliability because of the slide portion. Then, it is taken in consideration that the two-dimensional image data would be transmitted wirelessly to the rotating self-luminous two-dimensional display device side. However, for example, assuming that the screen image of the two-dimensional display device has 600×480 dots, the two-dimensional display device rotates 24 times per second, and the two-dimensional image having 3-bit (eight) colors is rewritten 180 times while rotating one time, a transfer rate of 600×480×3×180=3.5 Gbps is required. It is difficult to build a wireless channel for such a transfer rate.

Further, in the above-mentioned structure where electric power needed on a rotation board 406 side is supplied through a power supply line having a slide contact portion from the base unit 402 side to the rotation board 406 side by means of wiring, its durability is limited due to wear of the slide contact portion, and there is another problem that electric noise may occur if the contact of the slide contact portion is not smooth. Moreover, the image data need to be separately transmitted by providing another slide contact portion in an electronic circuit 508 on the rotation board 406 side. This slide contact portion also has a similar problem in durability and noise generation.

Furthermore, in the above-mentioned volumetric-scan type three-dimensional display unit, the displayed three-dimensional image is only still or regularly moves, so that the three-dimensional image cannot be changed corresponding to changes of external situations, such as a motion of a surrounding viewer, so as to provide a display most suitable for the external situations or showing the changes of the external situations.

The present invention is found out in view of the above-mentioned situation. One aspect of the present invention is to provide a three-dimensional image display apparatus which can clearly display a three-dimensional image having a quality of a practical use level by using a rotating self-luminous two-dimensional display device, especially irrespective of its screen size.

The present invention is found out in view of the above-mentioned situation. Another aspect of the present invention is to provide a three-dimensional image display apparatus which can easily transmit image data to a rotating self-luminous two-dimensional display device side by way of wireless communications and can display a three-dimensional image having a quality of a practical use level by using the rotating self-luminous two-dimensional display device.

The present invention is found out in view of the above-mentioned situation. Another aspect of the present invention is to provide a three-dimensional image display apparatus which can simultaneously supply electric power and image data wirelessly to a rotating self-luminous two-dimensional display device side, comprise a rotating mechanism of the two-dimensional display device for facilitating the electric power transmission and image data transmission by wireless means, and display a three-dimensional image having a quality of a practical use level by using the rotating self-luminous two-dimensional display device.

The present invention is found out in view of the above-mentioned situation. Another aspect of the present invention is to provide a three-dimensional image display apparatus which can display a three-dimensional image having a quality of a practical use level by using a rotating self-luminous two-dimensional display device.

The present invention is found out in view of the above-mentioned situation. Another aspect of the present invention is to provide a three-dimensional image display apparatus which can display a three-dimensional image having a quality of a practical use level by using a rotating self-luminous two-dimensional display device, and can change the display of the three-dimensional image corresponding to external information.

In order that the present invention may attain the above-mentioned aspects, a three-dimensional image display apparatus which displays a three-dimensional image as a set of the above-mentioned two-dimensional images by switching and displaying the two-dimensional images on the rotating self-luminous two-dimensional display panel while synchronizing with the rotation angle, is characterized by comprising a rotation body for rotating the above-mentioned two-dimensional display panel while fixing and supporting, a support body for rotatably supporting the above-mentioned rotation body, compression means mounted on the above-mentioned support body for compressing image data to display the above-mentioned two-dimensional image on the above-mentioned two-dimensional display panel, transmission means mounted on the above-mentioned support body for transmitting the above-mentioned compressed image data to the rotation body side, reception means mounted on the above-mentioned rotation body for receiving the above-mentioned transmitted compression image data, and expansion means mounted on the above-mentioned rotation body for expanding the above-mentioned received compression image data so as to restore an original image data.

In order that the present invention may attain the above-mentioned aspect, in a three-dimensional image display apparatus which displays a three-dimensional image as a set of the above-mentioned two-dimensional images by switching and displaying the two-dimensional images on a rotating self-luminous two-dimensional display panel while synchronizing with the rotation angle, the above-mentioned two-dimensional display panel comprises: memory means for storing image data of the above-mentioned two-dimensional image; and display means for reading the above-mentioned image data from the above-mentioned memory means while synchronizing with rotation of the above-mentioned two-dimensional display panel, so as to display an image corresponding to the read image data on the display unit of the above-mentioned two-dimensional display panel.

In order that the present invention may attain the above-mentioned aspect, a three-dimensional image display apparatus which displays a three-dimensional image as a set of the above-mentioned two-dimensional images by switching and displaying the two-dimensional images on a rotating self-luminous two-dimensional display panel while synchronizing with the rotation angle, is characterized by comprising a rotation body for rotating the above-mentioned two-dimensional display panel while fixing and supporting, a support body for rotatably supporting the above-mentioned rotation body, a plurality of magnets arranged at the back of the above-mentioned rotation body, a plurality of drive coils arranged at the above-mentioned support body, as opposed to the above-mentioned plurality of magnets; and drive means for causing a current whose polarity reverses according to relative positions of the above-mentioned magnets to the above-mentioned plurality of coil to flow in the above-mentioned plurality of coils.

In order that the present invention may attain the above-mentioned aspect, a three-dimensional image display apparatus which displays a three-dimensional image as a set of the above-mentioned two-dimensional images by switching and displaying the two-dimensional images on a sheet of rotating self-luminous two-dimensional display panel while synchronizing with the rotation angle, is characterized by comprising: memory means for storing image data of the above-mentioned two-dimensional image displayed on the above-mentioned two-dimensional display panel; display means for reading the above-mentioned image data from the above-mentioned memory means while synchronizing with rotation of the above-mentioned two-dimensional display panel so as to display the two-dimensional image corresponding to the read image data on the display unit of the above-mentioned two-dimensional display panel; input means for inputting external information; and display shift control means for changing a timing to read the above-mentioned image data from the above-mentioned memory means according to the above-mentioned inputted external information and shifting a display position of the above-mentioned three-dimensional image in the direction of rotation of the above-mentioned two-dimensional display panel, or in the reverse direction thereto.

As described above in detail, according to the present invention, a large amount of image data displayed on the self-luminous two-dimensional display device which rotates at a high speed revolution while synchronizing with its rotation angle, are compressed and transmitted from a support body side to the rotation body side, so that an amount of transmitting image data per unit of time can be reduced considerably and a transfer rate can be lowered, thereby avoiding the need for providing a very high-speed transfer rate to data communications between the support body and the rotation body, and easily transferring the above-mentioned large amount of image data to the support body side by means of a usual communication system.

Further, by means of an organic EL panel as the rotating self-luminous two-dimensional display device, the refresh rate at the time of switching and displaying the two-dimensional cross-sectional images on this organic EL panel while synchronizing with its rotation angle, can be made fast, so that the three-dimensional image as a set of the above-mentioned two-dimensional and cross-sectional images may be displayed without flickers, thus realizing the three-dimensional image display apparatus of a practical use level.

Furthermore, usual wireless communications are used for communications between the support body and the rotation body, so that mechanical portions such as the slide portion can be removed from a transmission channel so as to improve the durability and reliability of the above-mentioned communications.

Still further, when a difference between two adjoining image data in the image data switched and displayed on a two-dimensional display device is obtained and compressed, and the two adjoining image data are not so much different, the compression is performed effectively, thus considerably reducing the amount of image data to be transmitted.

Moreover, even when the usual two-dimensional display panel is used which does not contain the memory means as a self-luminous two-dimensional display panel, the image data expanded and restored is temporarily held in the memory means provided outside the two-dimensional display panel, then the image data can be read from the above-mentioned memory means while synchronizing with the rotation angle so as to be displayed on the two-dimensional display panel, so that the timings to compress, transmit, and expand the image data can be chosen independently of the rotation angle of the two-dimensional display panel, thus easily control the operational timings of the compression, the transmission, and the expansion, and simplifying the control system.

Further, since one that has therein the memory means is used as the self-luminous two-dimensional display panel, the image data is read from the above-mentioned memory means while synchronizing with the rotation angle and displayed on the display unit of the two-dimensional display panel, so that the image data expanded and restored may only be written in the above-mentioned memory means independently of the synchronous timing of the above-mentioned rotation angle, thus easily controlling the operational timings of the compression, the transmission, and the expansion, and simplifying the control system.

As described above in detail, according to the present invention, the rotating self-luminous two-dimensional display panel is provided therein with means for temporarily storing the image data of the two-dimensional image to be displayed while synchronizing with the rotation angle, then reading it and displaying it on the display unit, so that a time constant can be made small regardless of the screen size of the two-dimensional display panel, by shortening a wiring line through which the read image data is supplied to a display driving transistor, whereby the refresh rate can always be at a high speed and a clear three-dimensional image can be displayed.

Further, the above-mentioned structure allows one that originally has a high-speed refresh rate to make its refresh rate faster, so that a changeover of the two-dimensional images to be displayed on the two-dimensional display panel can be accelerated, thus improving a resolution and an angular resolution of the displayed three-dimensional image, and displaying a clearer three-dimensional image.

Furthermore, since the image data which is temporarily stored and then read is displayed while synchronizing with the rotation angle of the two-dimensional display panel, the timing to store the image data does not need to synchronize with the rotation angle of the two-dimensional display panel, to thereby simplify the circuit and reduce power consumption.

Still further, when the three-dimensional image to be displayed is a still image, once the image data of the two-dimensional image for one revolution to be displayed on the two-dimensional display panel is stored, then it is not necessary to rewrite the image data henceforth, so that an operation of reading the stored image data and displaying it on the two-dimensional display panel may only be performed, thus stopping various operations in circuits, such as storing the image data, image processing prior to it, etc, and considerably reducing power consumption.

Moreover, as described above, the refresh rate can always be made to be at a high speed without dependence upon the screen size, so that a large-scaled screen for the two-dimensional display panel can be provided. Further, by controlling shifting of the timings to read and display the temporarily memorized image data while synchronizing with rotation of the two-dimensional display panel, the display position of the three-dimensional image is shifted in the direction of rotation of the two-dimensional display panel, or in the reverse direction thereto, so as to display the image data.

Furthermore, the above-mentioned effects can be reliably obtained by using an organic electro-luminescent panel having built-in memory elements as the self-luminous two-dimensional display panel. Moreover, as the rotating organic EL panel, one that provides the double-sided emission may be used for displaying the same two-dimensional cross-sectional image on both sides simultaneously, so that a three-dimensional image without flicker can be displayed with a reduced number of revolutions.

Further, as a rotating organic EL panel, two sheets of organic EL panels providing single-sided emission are laminated together with their non-emissive surfaces to obtain one sheet of double-sided emission organic EL panel, so that a brighter three-dimensional image without flicker can be displayed with a reduced number of revolutions.

As described above in detail, in accordance with the present invention, according to a relative position of the plurality of magnets arranged at the back of the rotation body to the plurality of drive coils arranged at the support body as opposed to the above-mentioned plurality of magnets, the rotating mechanism for rotating the rotation board is employed in which an alternating current whose polarity reverses, for example, is caused to flow in the above-mentioned plurality of coils, so as to generate repulsive force and attractive force between the drive coils and the magnets and rotate the rotation board in one direction, whereby the rotation body can be rotated at a high speed and smoothly.

Further, by using a part of the above-mentioned rotating mechanism, the electric power can be simultaneously transmitted to the two-dimensional display device side by wireless means, thus reducing the number of components by interchanging components to be used and reducing the production costs of the device.

Furthermore, by using a part of the above-mentioned rotating mechanism, the electric power and the image data can be simultaneously transmitted to the two-dimensional display device side by wireless means, thus reducing the number of components by greatly interchanging components to be used and further reducing the production costs of the device.

Moreover, apart from the above-mentioned rotating mechanism, by wirelessly transmitting the electric power to the two-dimensional display device side by way of magnetic coupling, a rotating mechanism system and an electric power transmission system can be optimized respectively, thus improving the efficiency of the rotating mechanism system and the electric power transmission system.

Further, the image data may be transmitted over the electric power transmission system prepared apart from the above-mentioned rotating mechanism, so that the number of components can be reduced and the production costs of the device can be reduced further. Furthermore, apart from the above-mentioned rotating mechanism and the electric power transmission system, by wirelessly transmitting the image data, the communication system can be optimized and image data can be efficiently transmitted to the two-dimensional display device side.

As described above in detail, the organic electro-luminescent panel is used as the two-dimensional display panel, so that the three-dimensional image can clearly be displayed at a quality of a practical use level. Further, the position of the three-dimensional image displayed according to the external input information is rotated, so that the display position of the three-dimensional image can be easily changed according to the input information without changing the original two-dimensional image.

Furthermore, the two-dimensional image according to the collected external information is generated, so that the three-dimensional image as a set of this two-dimensional image can be changed. Still further, when various sensors etc. are arranged around the circumference of the device, and, for example, a two-dimensional image of a shape of a receptionist according to the external information collected by these sensors is generated, if a visitor comes, it is possible to display a three-dimensional receptionist which changes according to gestures performing reception turning to this visitor as well as to establish a friendly and intuitive interface which does not impress a machine by outputting sound which tells a greeting, guidance, etc. in response to the visitor's voice through a speaker attached to the circumference of the device.

BRIEF DESCRIPTION OF THE DRAWINGS

FIG. 5 is a circuit diagram showing a structure of a source signal-line drive circuit 84 as shown in FIG. 3;

FIG. 6 is a circuit diagram showing a structure of a display gate signal-line drive circuit 88 as shown in FIG. 3;

FIGS. 10A to 10C are schematic representation for explaining a method of generating difference data with respect to changes of a spherical three-dimensional object image data over time by means of a control unit 10 as shown in FIG. 2;

FIGS. 11A and 11B are schematic representation for explaining a method of creating a cross-sectional image data from the three-dimensional object image data restored by a control unit 20 as shown in FIG. 2;

FIG. 12 is a schematic representation for explaining compression and expansion operation of a compression unit 14 and an expansion unit 24 as shown in FIG. 2;

FIG. 13 is a chart showing an example of a structure of the cross-sectional image data inputted into the display unit 82 as shown in FIG. 3;

FIG. 33 is a schematic representation for explaining a principle allowing displaying the three-dimensional image by means of the volumetric scan type three-dimensional display unit as shown in FIG. 32.

DESCRIPTION OF THE PREFERRED EMBODIMENTS

The aspect to clearly display the three-dimensional image having a quality of a practical use level without dependence upon the screen size, by using the rotating self-luminous two-dimensional display is realized by using the organic electro-luminescent panel having built-in memory elements which stores the image data, as the above-mentioned two-dimensional display.

The aspect to perform transmitting the electric power and the image data to the rotating self-luminous two-dimensional display device side simultaneously and wirelessly, comprising the rotating mechanism of the two-dimensional display device which facilitated the electric power transmission and the image data transmission by wireless means, and displaying the three-dimensional image having a quality of a practical use level by using the rotating self-luminous two-dimensional display device, is realized by employing the rotating mechanism for rotating the rotation board in which the alternating current whose polarity reverses, for example, is caused to flow in the above-mentioned plurality of coils, so as to generate the repulsive force and the attractive force between the drive coils and the magnets and rotate the rotation board in one direction, according to the relative position of the plurality of magnets arranged at the back of the rotation body to the plurality of drive coils arranged at the support body as opposed to the above-mentioned plurality of magnets, and by using the organic electro-luminescent panel as the self-luminous two-dimensional display device.

The aspect to display the three-dimensional image which displays the two-dimensional image on the rotating self-luminous two-dimensional display synchronizing with the rotation angle and has a quality of a practical use level, and to change the display of the three-dimensional image corresponding to the external information, is realized by using the organic electro-luminescent panel as the above-mentioned two-dimensional display and collecting the external information so as to reflect an analysis effect of the collected information onto the display control of the three-dimensional image.

Figure 1:
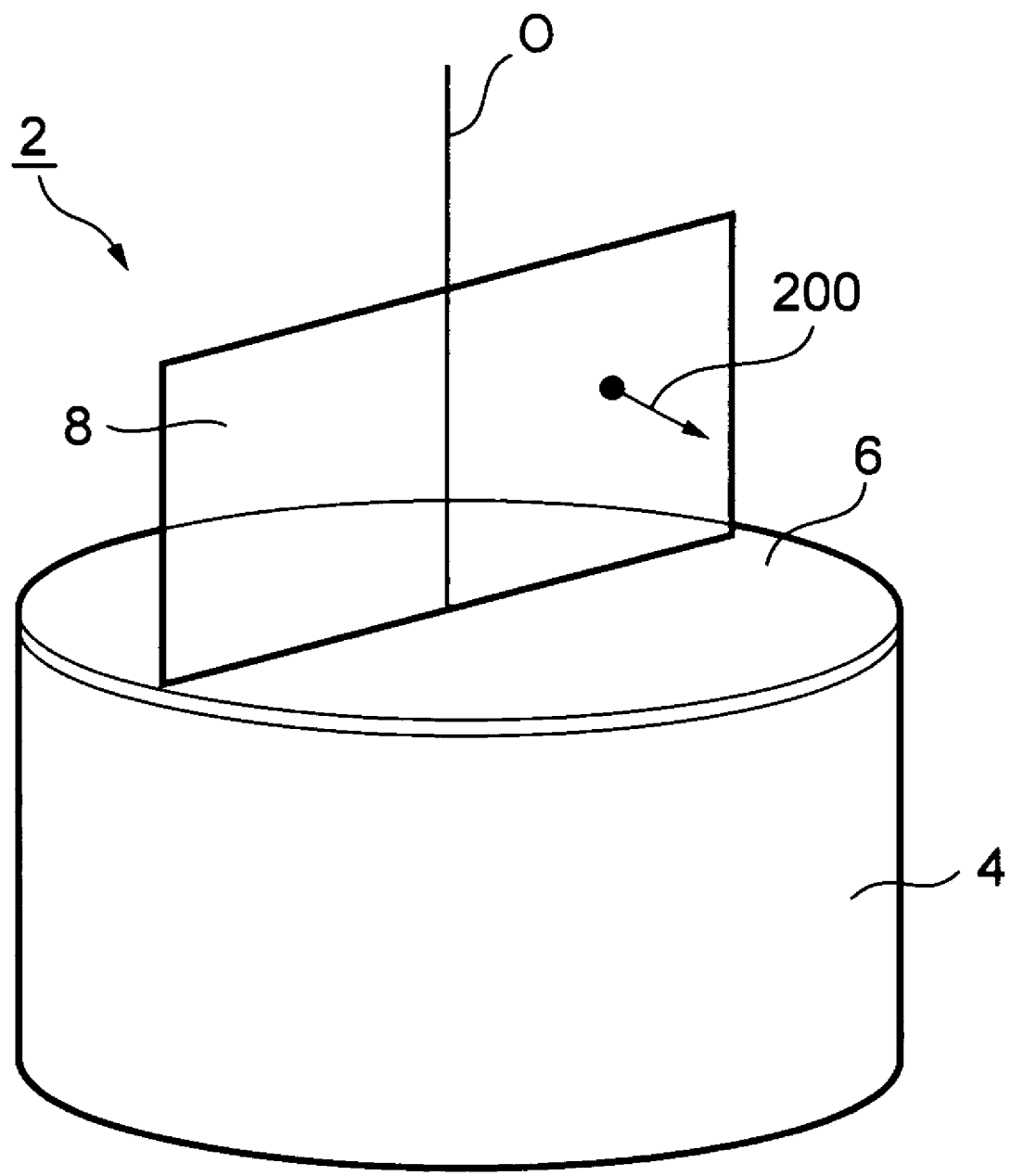
FIG. 1 is a perspective view showing an example of appearance of a three-dimensional image display apparatus in accordance with a first preferred embodiment of the present invention.

FIG. 1 is a perspective view showing an example of appearance of a three-dimensional image display apparatus in accordance with a first preferred embodiment of the present invention.

A three-dimensional image display apparatus 2 is constituted by a cylindrical base unit 4, a disk-shaped rotation board 6 rotatably and perpendicularly provided on an upper surface of the base unit 4, and a sheet of rectangular organic electro-luminescence (hereinafter referred to as EL) panel 8 set up in the diametrical direction of the rotation board 6. This organic EL panel 8 is of an single-sided emission type, as indicated by an arrow 200. As the rotation board 6 rotates, the organic EL panel 8 also rotates and its rotation axis O corresponds to a central point of the rotation board 6. However, the two-dimensional display panel in the appended claims is equivalent to the organic electro-luminescent panel 8.

Figure 2:
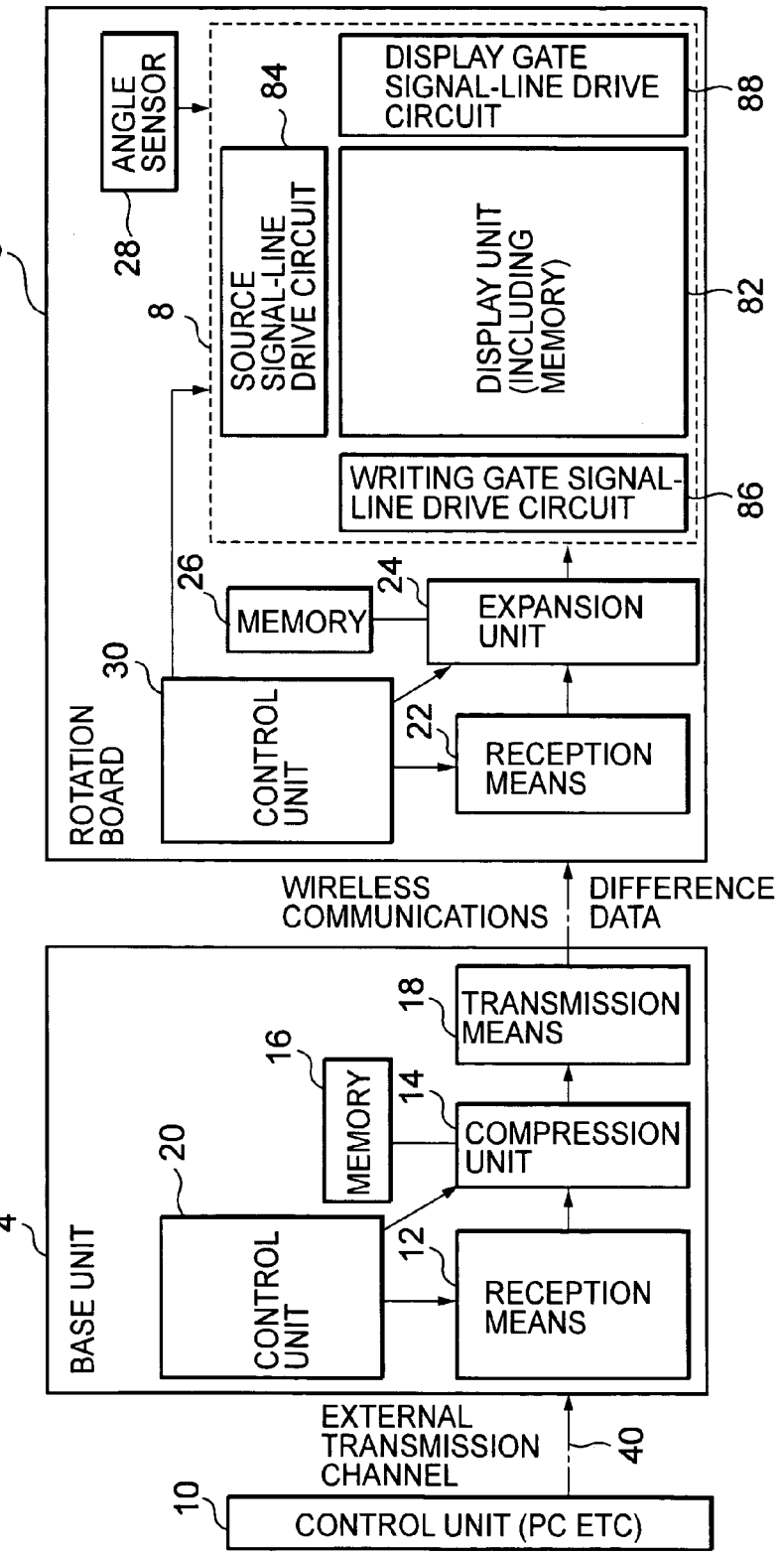
FIG. 2 is a block diagram showing a structure of a three-dimensional image display circuit which displays an image on an organic EL panel 8 as shown in FIG. 1.

FIG. 2 is a block diagram showing a structure of a three-dimensional image display circuit for displaying an image on the organic EL panel 8.

The three-dimensional image display circuit is separately installed in the base unit 4 and the rotation board 6. The base unit 4 side comprises reception means 12 for receiving image data and control information from the outside, a compression unit 14 for compressing the received image data, a memory 16 which provides a work area for the compression unit 14, transmission means 18 for transmitting the compressed image data to the rotation board 6 side, and a control unit 20 for performing image processing of the received image data etc.

The rotation board 6 side is provided with reception means 22 for receiving the compression image data transmitted from the base unit 4 side, an expansion unit 24 for expanding the received compression data and outputting the image data to the organic EL panel 8, a memory 26 which provides a work area for the expansion unit 24, an optical or mechanical angle sensor 28 for detecting the rotation angle of the organic EL panel 8 or the rotation board 6, and a control unit 30 for controlling the reception means 22 and the expansion unit 24.

Now, the organic EL panel 8 comprises a display unit 82 including the memory elements (memory) which is not shown, a source signal-line drive circuit 84 for writing the image data in the memory element included in the display unit 82, a writing gate signal-line drive circuit 86 by which the image data is written in the memory elements, and a display gate signal-line drive circuit 88, wherein the organic EL panel 8 is set up on the rotation board 6. However, the display unit in the appended claims is equivalent to the display unit 82, and the display shift control means is equivalent to the control unit 30.

In addition, the reception means 12 of the base unit 4 is connected to a control unit 10 which is constituted by a personal computer (PC) etc. through an external communication channel 40.

Figure 3:
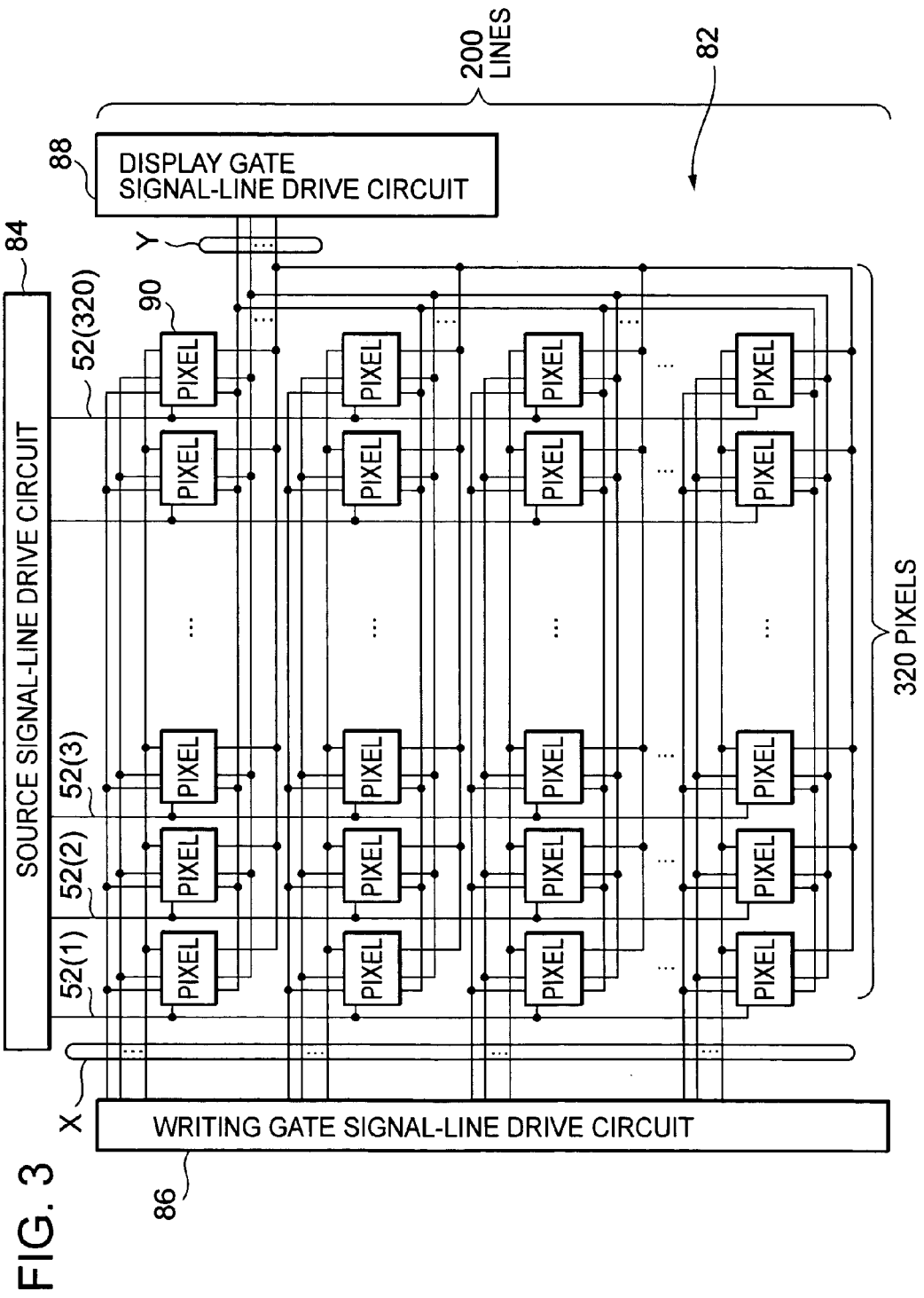
FIG. 3 is a circuit diagram showing a circuit structure of a display unit 82 as shown in FIG. 2.

FIG. 3 is a circuit diagram showing a circuit structure of the display unit 82. The display unit 82 is constituted by pixels 90 where 320 pixels along the row direction and 200 pixels along the column direction are arranged in the shape of a matrix. Respective pixels 90 are connected with a plurality of source signal lines 52(1) to 52(320) extending from the source signal-line drive circuit 84, a plurality of writing gate signal lines X extending from the writing gate signal-line drive circuit 86, and a plurality of display gate signal lines Y extending from the display gate signal-line drive circuit 88.

Figure 4:
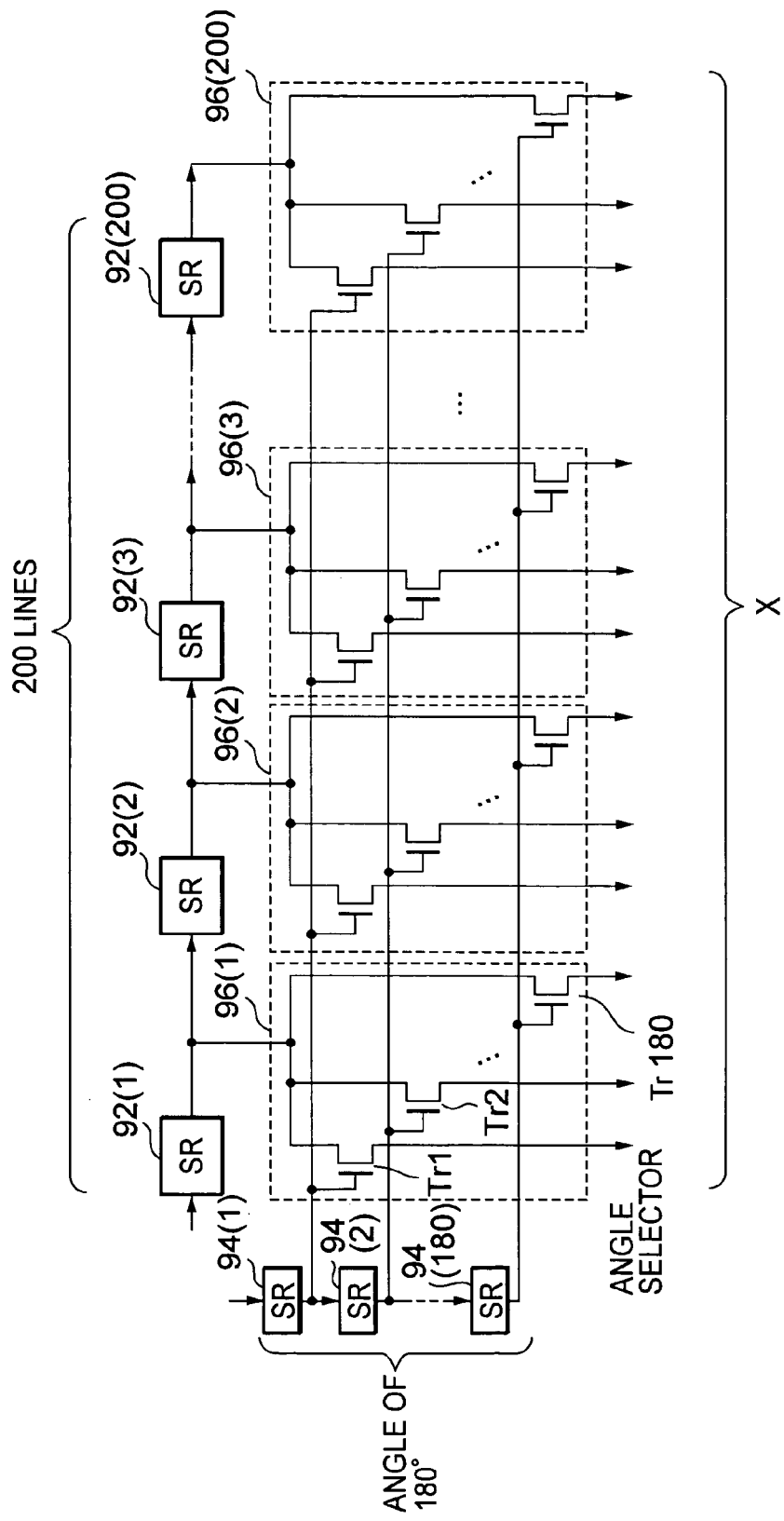
FIG. 4 is a circuit diagram showing a structure of a writing gate signal-line drive circuit 86 as shown in FIG. 3.

FIG. 4 is a circuit diagram showing a structure of the writing gate signal-line drive circuit 86 as shown in FIG. 2 and FIG. 3. The writing gate signal-line drive circuit 86 comprises shift registers (SR) 92(1) to 92(200) for selecting which rows to activate in the writing gate signal lines X, shift registers (SR) 94(1) to 94(180) for selecting which writing gate signal lines 1 to 180 (see FIG. 7) to activate, corresponding to rotation angles (in this example, 0 degree (angle 1), 2 degrees (angle 2), 4 degrees (angle 3), . . . , 358 degrees (angle 180)) of the organic EL panel 8 in the chosen rows, and transistor groups 96(1) to 96(200) each comprising transistors Tr1 to Tr180 which drive the writing gate signal lines 1 to 180 for each line.

FIG. 5 is a circuit diagram showing a structure of the source signal-line drive circuit 84 as shown in FIG. 2 and FIG. 3. The source signal-line drive circuit 84 comprises shift registers (SR) 98(1) to 98(320) for selecting which rows to activate in the source signal lines X, latches (LAT) 152(1) to 152(320) for latching the image data over a video signal line 150 when a held value of the shift register 98(1) to 98(320) is "1", latches 154(1) to 154(320) for latching respective image data latched to the latches 152(1) to 152(320) simultaneously with the completion of latching the image data by means of the latch 152(320), a control signal line 156 for transmitting a control signal which causes latches 154(1) to 154(320) to operate.

FIG. 6 is a circuit diagram showing a structure of the display gate signal-line drive circuit 88 as shown in FIG. 2 and FIG. 3. There are provided shift registers (SR) 160(1) to 160(180) for selecting, by angle, which display gate signal line to activate in the display gate signal lines 1 to 180(Y) as shown in FIG. 7 (which will be described later) while synchronizing with the rotation angle of the organic EL panel 8.

Figure 7:
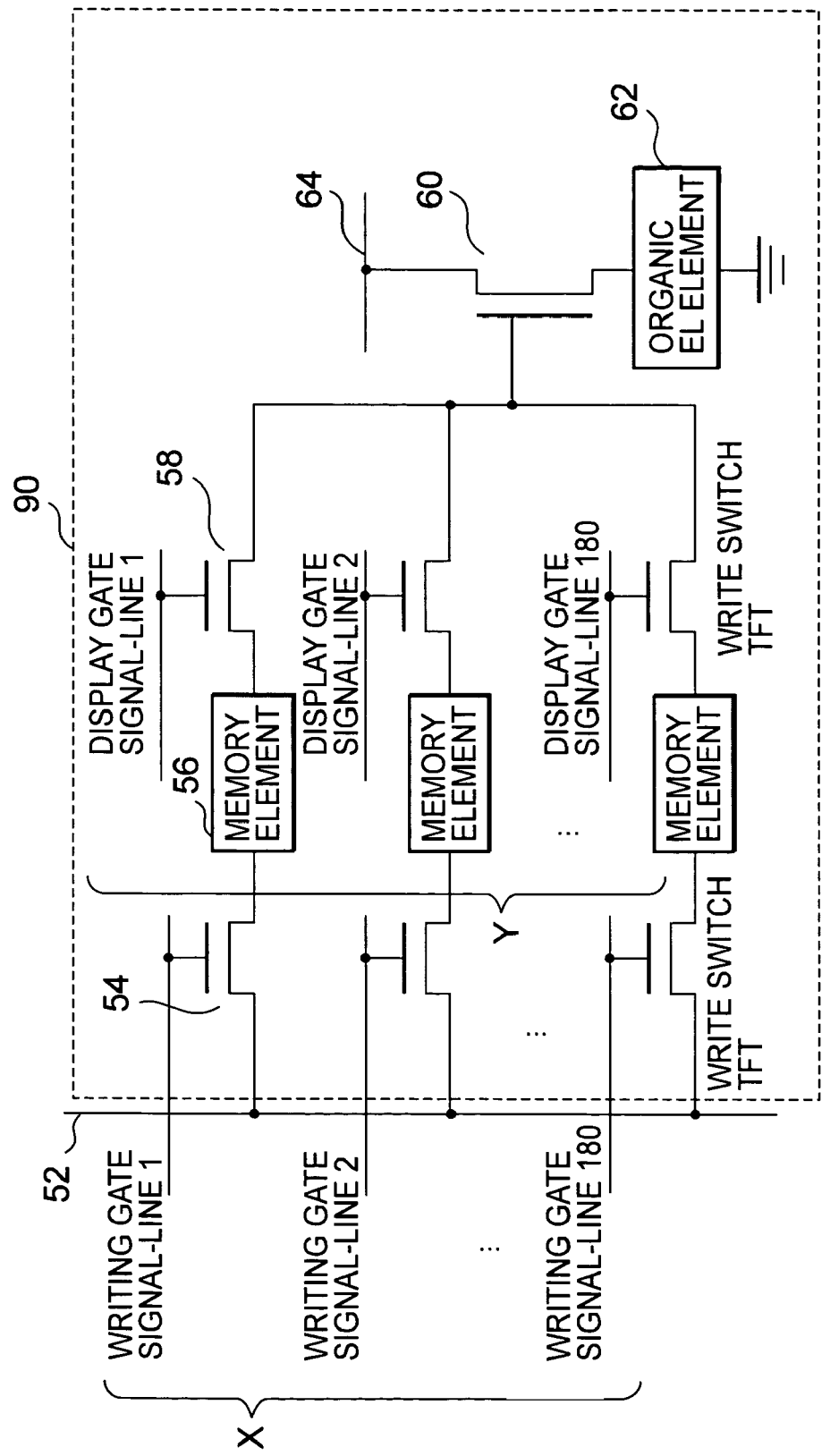
FIG. 7 is a circuit diagram showing a circuit structure of pixels 90 which constitute the display unit 82 as shown in FIG. 2.

FIG. 7 is a circuit diagram showing a circuit structure of the pixels 90 which constitute the display unit 82 as shown in FIG. 2 and FIG. 3. The write side of a memory element 56 such as SRAM, is connected to a source signal line 52 through a write switch transistor (TFT) 54. The reading side of this memory element 56 is connected through a display switch transistor (TFT) 58 to a gate of an EL drive transistor (TFT) 60 which drives an organic EL element 62.

N write switch transistors 54, N memory elements 56, and N display switch transistors 58 are arranged, where N is the number (rotational resolution N=180) obtained by dividing 360 degrees by a rotation angle (in this case, 2 degrees) for switching images to be displayed on the organic EL panel 8. Gates of the write switch transistors 54 are connected to the writing gate signal lines X (X=1 to 180). Gates of the display switch transistors 58 are connected to the displaying signal lines Y (Y=1 to 180). Sources of the EL drive transistors 60 are connected to a power supply wire 64, and drains to the organic EL element 62. The other end (cathode side) of the organic EL element 62 is grounded. However, the memory means in the appended claims is equivalent to the memory element 56 and the write switch transistor 54, and the source signal-line drive circuit 84 and the writing gate signal-line drive circuit 86 as shown in FIG. 3. The display means is equivalent to the display gate signal-line drive circuit 88 as shown in FIG. 3 and the display switch transistor 58.

Figure 8:
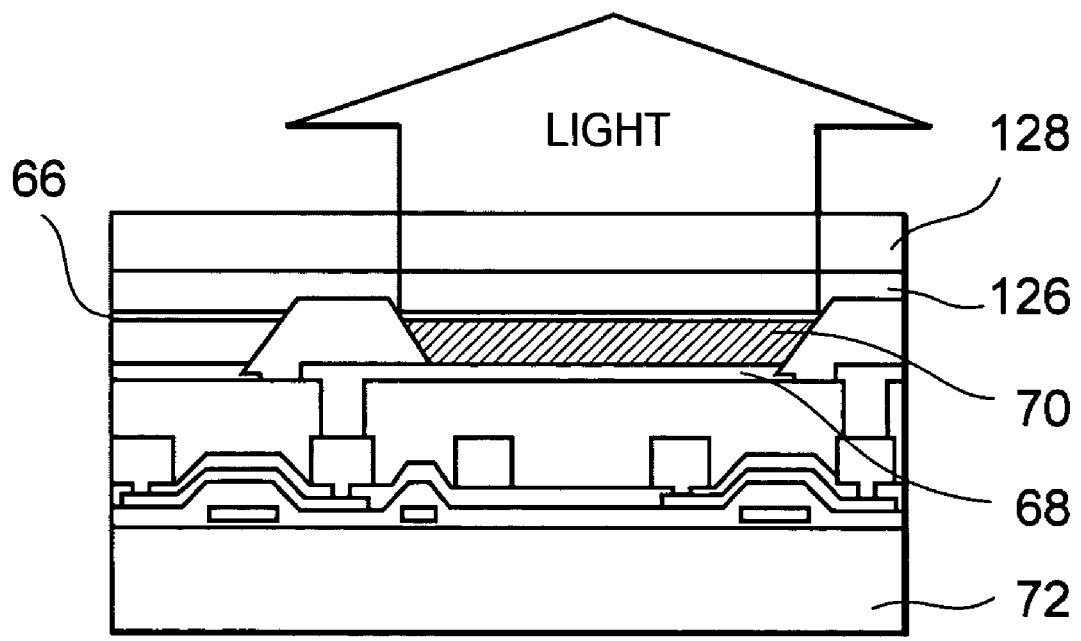
FIG. 8 is a cross-sectional view showing a structure of an organic EL element 62 which constitutes the pixels 90 of the display unit of the organic EL panel as shown in FIG. 7.

FIG. 8 is a cross-sectional view showing a structure of the organic EL element 62 which constitutes the pixels 90 as shown in FIG. 7. A lamination body where an organic luminescence layer (luminescence layer in the figure) 70 is sandwiched between a light transmissive cathode 66 and a metal anode 68 is formed on a glass substrate 72 so that the organic EL element 62 is constituted. When a voltage is applied across the light transmissive cathode 66 and the metal anode 68, the organic luminescence layer 70 emits light. The light is reflected by the metal anode 68 and emitted in one direction through the light transmissive cathode 66, a protection layer 126, and a transparent seal 128. In addition, the memory elements 56 as shown in FIG. 7 may be mounted in a glass substrate 72, for example.

Figure 9A:
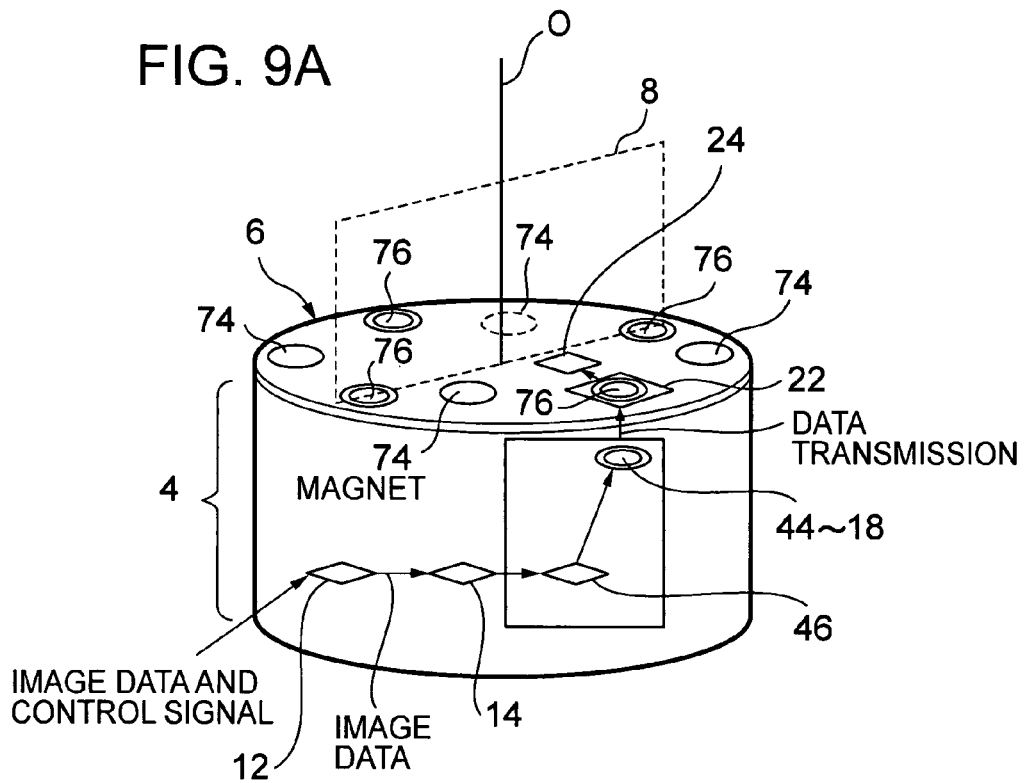
FIGS. 9A to 9C are a perspective view and plan views showing a rotating mechanism which rotates a rotation board 6 as shown in FIG. 1.
Figure 9B:
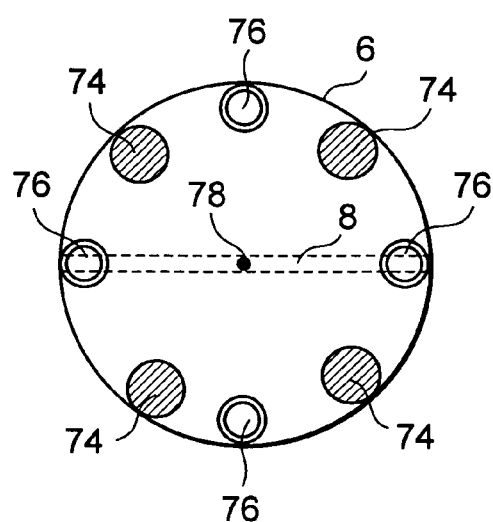
Figure 9C:
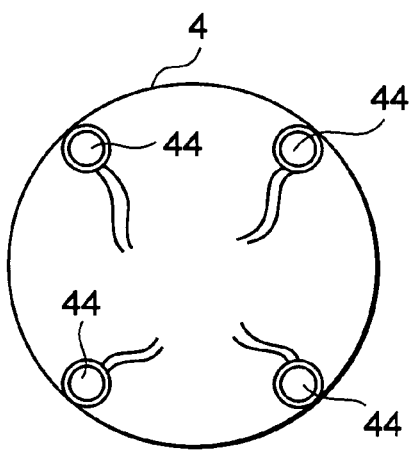
Figure 14:
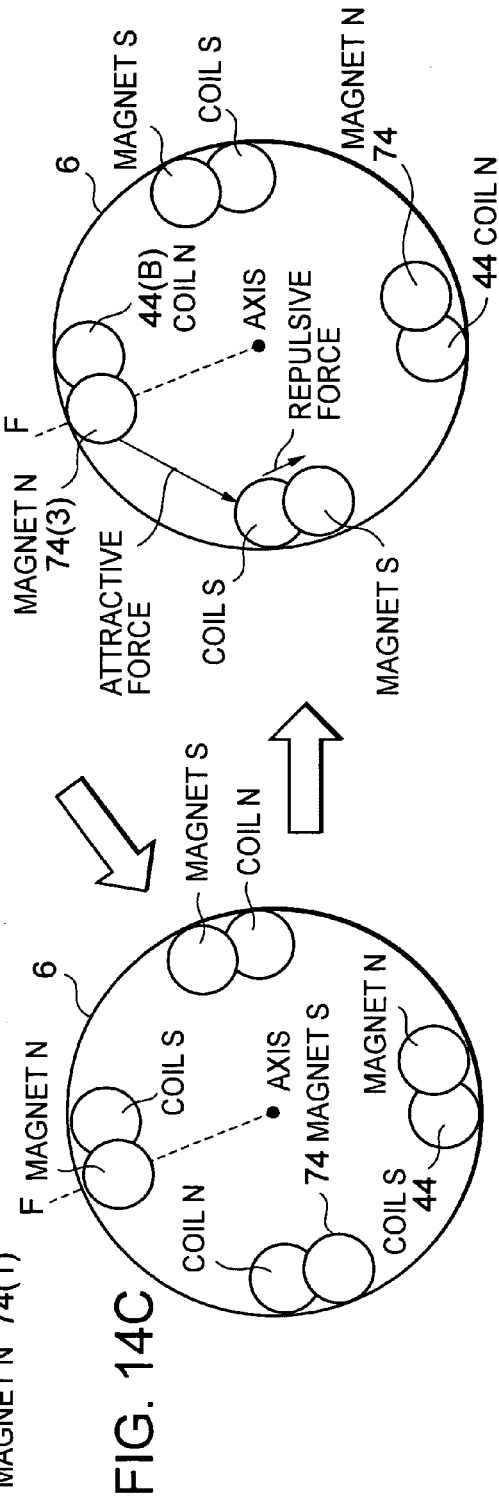
FIGS. 14A to 14D are schematic representation for explaining an operation of rotating the rotation board 6 as shown in FIG. 1 and FIGS. 9A to 9C.

FIG. 9A is a perspective view and FIGS. 9B and 9C are plan view showing a rotating mechanism which rotates the above-mentioned rotation board 6. As shown in IG. 9A the rotation board 6 is rotatably provided on the base unit 4 such that its center is pivoted by a shaft 78 (see FIG. 9B).

As shown in FIGS. 9A and 9B, at the back of the rotation board 6, 4 magnets 74 are arranged at regular intervals on the same circumference so that polarities of the adjacent magnets 74 may differ mutually. Further, reception coils 76 for receiving data and electric power are arranged at regular intervals among these magnets 74 on the circumference by which the above-mentioned magnets 74 are arranged. Furthermore, as shown in FIG. 9C, on the upper surface of the base unit 4, the drive coils 44 for driving the rotation board 6 and transmitting the data are arranged at regular intervals on the same circumference, and the winding directions of the adjoining drive coils 44 are caused to be reverse, so that the adjoining drive coils 44 may have mutually reverse polarities when current is passed through the drive coils 44. In addition, the diameter of the circumference where the magnets 74 are arranged and the circumference where the drive coils 44 are arranged are the same, and the transmission means 18 of the base unit 4 is constituted by the drive coil 44 and a signal amplifier 46. Further, the reception coil 76 of the rotation board 6 constitutes the reception means 22.

Next, an operation of the preferred embodiment will be described. Firstly, a schematic operation will be described by using FIG. 1. In FIG. 1, since the rotation board 6 provided on the upper surface of the base unit 4 rotates about the rotation axis O at a high speed (for example, 900 rpm), the organic EL panel 8 set up by the rotation board 6 rotates at a high speed revolution. In this status, a two-dimensional cross-sectional image data obtained when a three-dimensional object to be displayed is virtually cut by the organic EL panel 8 for each rotation angle (for example, 2 degrees) of the organic EL panel 8 is supplied from the base unit 4 side to the rotation board 6 side.

After storing the two-dimensional cross-sectional image data for each rotation angle in the memory elements (not shown) temporarily, the organic EL panel 8 reads the corresponding cross-sectional image data from the memory elements in accordance with the rotation angle of the organic EL panel 8 so as to blink a plurality of self-luminous pixels which are arranged in the shape of a matrix and constitute the display unit of the organic EL panel 8 according to this cross-sectional image data.

Thus, the two-dimensional cross-sectional image is displayed by means of the self-luminous pixels arranged in the shape of the matrix and switched while synchronizing with the rotation angle of the organic EL panel 8, so that a three-dimensional object image may be displayed as a set of a continuous two-dimensional cross-sectional images. In addition, an arrow 200 in the figure indicates a light emitting direction of the pixels of the organic EL panel 8. The organic EL panel 8 of this example is of the single-sided emission.

Here, the organic EL panel 8 has the following well known properties:
  (1) A speed of response of the organic EL element which constitutes the pixel is fast (a few tens of microseconds);
  (2) Since the organic EL element is self-luminous, an increased viewing angle (close to 180 degrees) is provided;
  (3) Since the organic EL element is self-luminous, a high definition, high brightness, and high contrast can be realized; and
  (4) Since the organic EL element is self-luminous, it is very thin (about 1 mm).

Therefore, as the self-luminous two-dimensional display device which switches and directly displays a display image while synchronizing with the rotation angle, the organic EL panel 8 with the above-mentioned properties is used, so that a clear image of the three-dimensional object can be displayed as the three-dimensional image.

The operation of the preferred embodiment will be described in more detail hereafter. For example, the control unit 10 of FIG. 2 generates difference data 302, 304 with respect to changes of a spherical three-dimensional object image data over time as shown in FIGS. 10A, 10B, and 10C, which should be displayed, and transmits these difference data to the reception means 12 of the base unit 4 through the external communication channel 40.

The control unit 20 of the base unit 4 restores the original three-dimensional object image data from the difference data 302, 304 received by the reception means 12 through the external communication channel 40. Further, from the restored three-dimensional object image data, the control unit 20 generates a cross-sectional image data produced when the three-dimensional object is virtually cut at a surface of the organic EL panel 8 for each rotation angle (for example, 2 degrees) of the organic EL panel 8, and outputs these sectional image data to the compression unit 14 one by one.

At this stage, for example, if the restored three-dimensional object is a sphere 802 as shown in FIG. 11A, the control unit 20 generates the cross-sectional image data from the cross-sectional image produced when the three-dimensional object is virtually sliced at the surface of the organic EL panel 8, for each of the rotation angles of the organic EL panel 8. In this case, as shown in FIG. 11B, cross-sectional image data 102, 104, 106, 108, 110 at rotation angles of 0 degree, 2 degrees, 4 degrees, 6 degrees, 8 degrees of the organic EL panel 8 are generated and outputted to the compression unit 14 one by one. The same is applied to the rotation angles of 10 degrees or more. Thus, 180 sheets of cross-sectional image data are generated for each rotation of the organic EL panel 8.

Using the memory 16, the compression unit 14 computes the difference data between the cross-sectional image data, which is one data before, and the cross-sectional image data displayed next, and outputs the obtained difference data to the transmission means 18. The transmission means 18 transmits the difference data to be inputted to the rotation board 6 side by way of wireless communications using electromagnetic coupling. In addition, the wireless communications will be described later.

The reception means 22 of the rotation board 6 receives the above-mentioned difference data transmitted from the base unit 4, so as to be outputted to the expansion unit 24. Using the memory 26, the expansion unit 24 restores the cross-sectional image data for each rotation angle of the organic EL panel 8 from the difference data inputted, and outputs the restored cross-sectional image data to the organic EL panel 8 one by one.

Next, a compression operation of the cross-sectional image data by means of the compression unit 14 will be described with reference to FIG. 12. Using the memory 16, the compression unit 14 computes the difference data between the cross-sectional image data displayed one data before and the cross-sectional image data displayed next. For example, assuming that the cross-sectional image data which is one data before is a data as depicted by 212 of FIG. 12 and the cross-sectional image data displayed next is a data as depicted by 214 of FIG. 12, the difference data may be a hatched portion as depicted by 216 of FIG. 12. The difference data thus compressed by the compression unit 14 and obtained is outputted to the transmission means 18. The transmission means 18 transmits the difference data to be inputted to the rotation board 6 side by way of wireless communications using electromagnetic coupling. In addition, the wireless communications will be described later.

The reception means 22 of the rotation board 6 receives the above-mentioned difference data transmitted from the base unit 4, so as to be outputted to the expansion unit 24. Using the memory 26, the expansion unit 24 restores the cross-sectional image data, for each rotation angle of the organic EL panel 8, from the difference data to be inputted. When the cross-sectional image data restored one data before by this expansion unit 24 is the data as depicted by 212 of FIG. 12, the difference data (hatched portion) 216 inputted this time is added to the cross-sectional image data 212, whereby the cross-sectional image data displayed next time as depicted by 214 of FIG. 12 is restored. The expansion unit 24 outputs the restored cross-sectional image data to the organic EL panel 8 one by one.

Next, an image display operation by means of the organic EL panel 8 will be described with reference to FIGS. 3 to 7, and FIG. 13. In FIG. 3, the source signal-line drive circuit 84 of the organic EL panel 8 and the writing gate signal-line drive circuit 86 activate the source signal line 52 and the writing gate signal line X one by one, and the cross-sectional image data are sent through the source signal line 52 to the pixels 90 connected to a position where these signal lines intersect, whereby the cross-sectional image data to be displayed by respective pixels 90 can be written in the memory elements 56 (see FIG. 7) of respective pixels 90. In this example, the memory elements 56 correspond to the rotational resolution (180, in this example) of the organic EL panel 8 and there are 180 pieces per pixel 90, so that all the cross-sectional image data for one revolution corresponding to the rotation angle of the organic EL panel 8 are written in respective memory elements 56 in one pixel.

Figure 13:
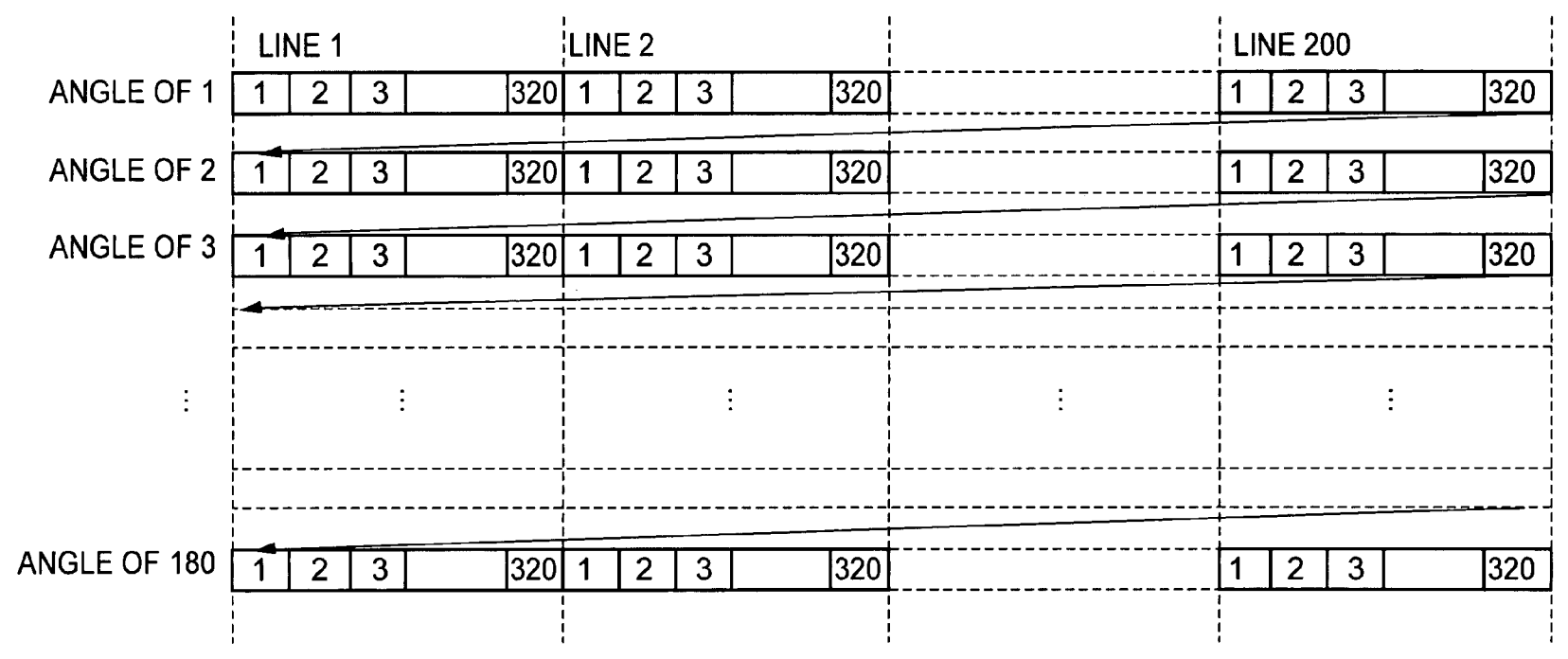

Now, an operation of the source signal-line drive circuit 84 will be described in more detail. When the image data of the angle 1 is written in the pixel 90 of a first row in FIG. 3, a start signal "1" is inputted into the shift register 98(1) of FIG. 5. At this timing the image data, which should be written in the pixel 90 of a first row and a first column, of the angle 1 as shown in FIG. 13 is outputted to the video signal line 150. However, portions as depicted by 1, 2, ..., 320 of FIG. 13 are the cross-sectional image data displayed on the pixels 90 of the first column through the 320th column of the display unit 82. As to these cross-sectional images, there are those for 180 angles a row. Further, there are such cross-sectional image data for the first row through the 200th row.

When the start signal "1" is inputted into the shift register 98(1), its output becomes "1", then the latch 152(1) latches the image data of the angle 1, which should be written in the pixel 90 of the first row and the first column on the video signal line 150.

At the next timing, a clock signal is inputted into all the shift registers 98, "1" held at the shift register 98(1) shifts to the shift register 98(2) and is held in this shift register 98(2). At this timing, the image data of the angle 1 as shown in FIG. 13, which should be written in the pixel 90 of the first row and the second column, is outputted to the video signal line 150. When "1" is inputted into the shift register 98(2), its output becomes "1", then the latch 152(2) latches the image data of the angle 1 which should be written in the pixel 90 of the first row and the second column on the video signal line 150.

Similar to the above description, each time "1" is shifted to and held in the shift registers 98(3) to 98(320) one by one, as shown in FIG. 13 the image data of the angle 1 which should be written in the pixels 90 of the first row and the third column, the first row and the fourth column, ..., the first row and the 320th column are respectively latched to the latches 152(3), 152(4), ..., 152(320). When the image data of the angle 1 are latched to all latches 152 in this way, the control signal of "1" is outputted to the control signal line 156, then the image data of the angle 1 which should be written in the pixels 90 of the first row and the first column, the first row and the second column, ..., the first row and the 320th column are latched to the latches 154(1) to 154(320) at the same time. The image data of the angle 1 which should be written in the pixels of the first row are outputted to the source signal lines (1) to (320) which are the output signal lines of the latches 154(1) to 154(320).

On the other hand, when the image data of the angle 1 are written in the pixels 90 of the first row of FIG. 3, if the start signal "1" is inputted into the shift register 92(1) as shown in FIG. 4 which constitutes the writing gate signal-line drive circuit 86, the output of the shift register 92(1) becomes "1" or changes into a high-level, so that the source of the transistors Tr1 to Tr18 in the transistor group 96(1) are changed into the high level which controls the writing gate signal line X of the first row and these transistors are changed into an operable status.

In this status, at the timing when the rotation angle of the organic EL panel 8 is the angle 1, if the start signal "1" is inputted into the shift register 94(1), the output of the shift register 94(1) becomes "1", then Tr1 of the transistor group 96(1) turns on, and a writing gate signal line 1 connected to a drain of Tr1 changes into "1", i.e., the high level, thus activating the memory elements 56 for the angle 1 of all the pixels 90 of the first row. At that time, since the image data of the angle 1 of the first row and the first column, the first row and the second column, ..., the first row and the 320th column are being outputted respectively through the source signal lines 52(1) to 52(320), the image data of the angle 1 are written in the memory elements 56 for the angle 1 of all the pixels 90 in the first row at the same time.

Next, at the timing when the rotation angle of the organic EL panel 8 is the angle 2, the clock signal is inputted into the shift register 94, and the signal "1" is shifted from the shift register 94(1) to the shift register 94(2) and held therein, so that Tr2 of the transistor group 96(1) turns on, and the writing gate signal line 2 connected to a drain of Tr2 changes into "1", i.e., high level, thus activating the memory elements 56 for the angle 1 of all the pixels 90 in the first row. At that time, a similar operation to that described above is repeated and the image data of the angle 2 of the first row and the first column, the first row and the second column, ..., the first row and the 320th column are being outputted respectively through source signal line 52(1) to 52(320), so that the image data of the angle 2 are written in the memory elements 56 for the angle 2 of all the pixels 90 of the first row at the same time. Similar to the above description, the image data of angles 3 to 180 are written in the memory elements 56 for the angles 3 to 180 of all the pixels 90 of the first row.

When the image data of the angles 3 to 180 are thus written in the memory elements 56 for the angles 3 to 180 of all the pixels 90 of the first row, the clock signal is outputted to the shift register 92 which constitutes the writing gate signal-line drive circuit 86, so that the signal "1" is shifted from the shift register 92(1) to the shift register 92(2), and the output of the shift register 92 changes into the high level, whereby the transistors Tr1 to T18 of the transistor group 96(2) which controls the writing gate signal line X connected to the pixel of the second row are changed into the operable status.

In this status, at the timing when the rotation angle of the organic EL panel 8 turns to the angle 1, if the start signal "1" is inputted into the shift register 94(1), the output of the shift register 94(1) becomes "1", then Tr1 of the transistor group 96(2) turns on, and the writing gate signal line 1 connected to the drain of Tr1 changes into "1", i.e., the high level, thus activating the memory elements 56 for the angle 1 of all the pixels 90 of the second row. At that time, since the image data of the angle 1 of the second row and the first column, the first row and the second column, ..., the first row and the 320th column are being outputted respectively through the source signal line 52(1) to 52(320), the image data of the angle 1 is written in the memory elements 56 for the angle 1 of all the pixels 90 of the second row at the same time. By repeating the above-mentioned operation, the image data of the angle 1 through the angle 180 for one revolution are stored in all the pixels 90 of 200 rows and 320 columns.

Next, a write operation for the above-mentioned cross-sectional image data will be described on a per pixel basis in FIG. 7. In FIG. 7, if the writing gate signal line 1 for writing the cross-sectional image data becomes the high level when the rotation angle of the organic EL panel 8 in the writing gate signal line X connected to this pixel 90 is the angle 1, then the write switch transistor 54 whose gate is connected to this writing gate signal line 1 is turned on, whereby the cross-sectional image data of the angle 1 is written in the memory elements 56 connected to this write switch transistor 54 through the source signal line 52. After that, when the writing gate signal line 1 turns to a low level, and the write switch transistor 54 is turned off, and then the writing gate signal line 2 becomes the high level, the write switch transistor 54 whose gate is connected to this writing gate signal line 2 is turned on, so that the cross-sectional image data at the time of the angle 2 is written in the memory elements 56 connected to this write switch transistor 54 through the source signal line 52. Similar to the above description, all the cross-sectional image data for one revolution of the organic EL panel 8 are stored respectively in 180 memory elements 56 provided in one pixel 90. Such writing of the cross-sectional image data for each of the above-mentioned rotation angles with respect to one pixel 90 is carried out for all the pixels 90 as shown in FIG. 3 similarly.

As described above, when all the cross-sectional image data for each rotation angle for one revolution of the organic EL panel 8 are stored in all the pixels 90 that constitute the display unit 82 as shown in FIG. 3, the display gate signal-line drive circuit 88 as shown in FIG. 6 performs operations as will be described hereafter. Namely, when a detection rotation angle of the angle sensor 28 is the angle 1, the display gate signal-line drive circuit 88 inputs the start signal "1" into a shift register 160(1), so as to cause the output of the shift register 160(1) to be "1", and cause the display gate signal line 1 connected to the output side of this shift register 160(1) to be "1." Next, when the detection rotation angle of the angle sensor 28 is the angle 2, the signal "1" is shifted to and held in a shift register 160(2), and the display gate signal line 2 connected to the output side of this shift register 160(2) is set to "1." Similar to the above description, the display gate signal lines Y are caused to be the high level one by one, while synchronizing with the detection rotation angle of the angle sensor 28. At this stage, when the display gate signal line 1 becomes the high-level, the cross-sectional image data of the angle 1 are simultaneously read from the memory elements 56 of all the pixels 90 that constitute the display unit 82, then the organic EL element 62 of each pixel 90 is blinked and the cross-sectional image of the angle 1 is displayed. Similar to the above description, the cross-sectional image data of the angle 2, the angle 3, . . . , the angle 180, are read respectively so as to blink the organic EL elements 62 of all the pixels 90 that constitute the display unit 82, whereby the cross-sectional images are switched one by one and displayed on the display unit 82 when the rotation angle of the organic EL panel 8 is the angle 2, . . . , angle 180.

Now, the display operation of the above-mentioned cross-sectional image will be described on a per pixel basis by using FIG. 7. In order to display cross-sectional image data when the rotation angle of the organic EL panel 8 is the angle 1, if the display gate signal line 1 becomes the high level, then the display switch transistor 58 whose gate is connected to this display gate signal line 1 is turned on, and the cross-sectional image data at the time of the angle 1 is read from the memory element 56 and supplied to the gate of the EL drive transistor 60. Consequently, when the cross-sectional image data is "1", the EL drive transistor 60 turns on, and a voltage is applied to the organic EL element 62 through the power supply wire 64 so as to emit light. When the cross-sectional image data is "0", the EL drive transistor 60 is turned off, the voltage is not applied to the organic EL element 62, and the light is not emitted.

Now, displaying the cross-sectional image for each rotation angle for one revolution on the organic EL panel 8 which rotates at a high speed revolution as described above, the three-dimensional images as a set of these cross-sectional images are displayed. In this case, when the rotation angle of the organic EL panel 8 of the display gate signal-line drive circuit 88 is the angle 1, the cross-sectional image data of the angle 1 is read from the memory elements 56 so as to blink the organic EL element 62 according to the read cross-sectional image data, so that the cross-sectional image of the angle 1 is displayed on the display unit 82. So are displayed the cross-sectional image of the angle 2, the angle 3, . . . , the angle 180 on the display unit 82, thus displaying the three-dimensional image in the regular position.

However, when the rotation angle of the organic EL panel 8 has the angle 1+α degrees, the cross-sectional image data of the angle 1 is read and displayed on the display unit 82, and similarly when it has the angle 2+α degrees, the cross-sectional image data of the angle 2 is read so as to display the cross-sectional image data for one revolution on the display unit 82, then the three-dimensional image to be displayed is also displayed in the position which is rotated from the regular position by α degrees. Therefore, the control unit 30 provides the rotation information a as mentioned above to the display gate signal-line drive circuit 88, so as to display the three-dimensional image, rotating the position by α degrees.

Next, a rotation operation of the rotation board 6 and an operation to transmit electric power from the base unit 4 side to the rotation board 6 side will be described with reference to FIGS. 9A to 9C and FIGS. 14A to 14D.

Firstly, the rotation operation will be described. Now, assuming that a relative spatial relationship between the magnets 74 arranged at the back of the rotation board 6 and the drive coils 44 arranged on the upper surface of the base unit 4 is as shown in FIG. 14A, the current is passed through the drive coils 44 so as to become a shown polarity. Attention will now be paid to a drive coil 44(A) which has become N pole, then a magnet 74(1) and a magnet 74(2) on both sides are respectively N pole and S pole, so that repulsive force and attractive force are generated with respect to the magnet 74(1) and the magnet 74(2) respectively. Similar repulsive force and attractive force are generated between another drive coil 44 and the magnets 74 on both sides, so that the rotation board 6 rotates in the direction of arrows in the figure. However, reference character F in the figure is a mark for recognizing the direction of rotation of the rotation board 6.

In this way, the relative spatial relationship between the magnets 74 arranged at the back of the rotation board 6 and the drive coils 44 arranged on the upper surface of the base unit 4 changes into that shown in FIG. 14B. Because of inertia force of the rotation board 6, the rotation board 6 overruns in the left direction of rotation, so that the relative spatial relationship between the magnets 74 arranged at the back of the rotation board 6 and the drive coils 44 arranged on the upper surface of the base unit 4 changes into that shown in FIG. 14C. In this status, the direction of the current which is flowing in the drive coil 44 is reversed so as to reverse its polarity as shown in FIG. 14D.

Thus, a drive coil 44(B) changes from S pole to N pole, so that repulsive force occurs with respect to an adjoining N-pole magnet 74(3). This is similarly applicable to that between another drive coil 44 and the magnet 74. After all the rotation board 6 continues rotation in the left direction of rotation. Thus, according to the relative position of the magnet 74 to the drive coil 44, the direction of the current flowing through the drive coil 44 is switched at a high speed, so that the rotation board 6 can be rotated at a high speed (900 rpm).

Figure 15:
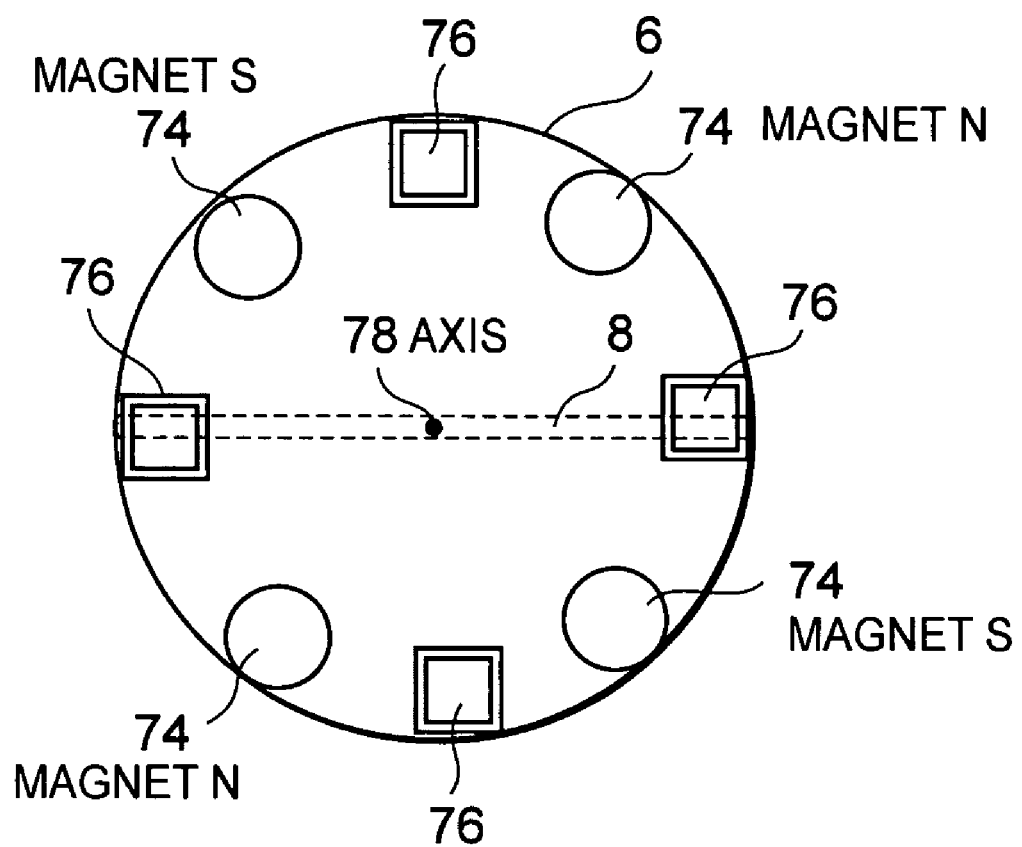
FIG. 15 is a view showing another preferred embodiment of the reception coil as shown in FIGS. 9A to 9C.

In addition, even if the reception coils 76 arranged at the back of the rotation board 6 are square-shaped as shown in FIG. 15, they have similar effects. Further, the drive coils 44 arranged on the base unit 4 side may also be square-shaped. Furthermore, although in the above-mentioned preferred embodiment the number of the magnets 74 arranged on the rotation board 6 side is four, the number of magnets 74 may only be any even number, for example two, six, eight, etc. Accordingly, an even number, such as two pieces, six pieces, or eight pieces, of drive coils 44 are arranged at the base unit 4 side. However, n magnets 74 arranged on the rotation board 6 side must be arranged so that dynamic balance of the rotation board 6 may be maintained. Moreover, the plurality of magnets 74 may be laid under the back of the rotation board 6, and the surface may be positioned at the same level as the back of the rotation board 6, so that air resistance at the time of rotation can be reduced.

Next, a transmission operation of electric power will be described. As shown in FIG. 9B, the reception coils 76 are arranged at the back of the rotation board 6 and on the same circumference as the magnet 74. Now, in order to rotate the rotation board 6, when a sine wave current is passed through the drive coils 44 on the base unit 4 side, when the polarity as an electromagnet of the drive coil 44 is switched, and when both coils approach closer to each other to have the spatial relationship where a center of the drive coil 44 and a center of the reception coil 76 are matched, the electromagnetic coupling of both coils becomes the maximum, so that a sine wave current similar to the sine wave current flowing on the drive coil 44 side is induced and generated on the reception coil 76 side. Therefore, four reception coils 76 may be connected such that induced currents may flow in the same direction, whereby the electric power needed by the rotation board 6 side can be taken out.

Finally, an operation to transmit the compressed image data from the base unit 4 side to the rotation board 6 side by way of wireless communications will be described. The sine wave current flowing on the drive coil 44 side by means of the transmission means 18 is modulated with the compressed image data which is inputted from the compression unit 14, whereby the sine wave current induced in the reception coil 76 also becomes a current modulated with the compressed image data. Then, the reception means 22 extracts the compression image data from the sine wave current induced in the reception coil 76 by using a high pass filter etc. so as to demodulate the compression image data.

According to the preferred embodiment, as the self-luminous two-dimensional display device which rotates at a high speed revolution, the organic EL panel 8 may be used so that the organic EL element 62 which constitutes the pixel 90 and provides a quick response can change and display the two-dimensional cross-sectional image at a high speed (for example, at a refreshment frequency of around 4.8 kHz), while synchronizing with the rotation angle of the organic EL panel 8, thus increasing the angular resolution. Since the three-dimensional image as a set of the above-mentioned two-dimensional and cross-sectional images can be displayed without flickers, the three-dimensional image display apparatus with a quality of a practical use level can be realized. Moreover, since it is not a projected image, the clear three-dimensional image can be displayed. In addition, the organic EL panel 8 in this example is of the single-sided emission type. However, the refresh rate of a sufficiently high speed can increase the number of revolutions of the organic EL panel 8, whereby even that of the single-sided emission type can provide the above-mentioned effects.

Further, since the organic EL element 62 is self-luminous, the large viewing angle is provided. Since the organic EL panel 8 allows the display image to be seen at any angle, the three-dimensional image as a set of continuous two-dimensional and cross-sectional images can be displayed completely, whereby a viewer can clearly see the displayed three-dimensional image from any position. Further, since the organic EL element 62 is self-luminous, it is possible to display the three-dimensional object image with a high definition (high resolution), high brightness, and high contrast, and to considerably raise the display quality of the three-dimensional image. Furthermore, since the organic EL element 62 is self-luminous, the organic EL panel 8 can be made very thinly, and it is possible to avoid a portion where the three-dimensional image cannot be displayed due to the thickness of the organic EL panel 8, thus clearly displaying the three-dimensional image without uncomfortable feeling.

Further, it is constructed in such a way that, for every pixel 90, all the cross-sectional image data to be displayed as the organic EL panel 8 rotates one time are temporarily stored in the memory elements 56, and then read out while synchronizing with the rotation angle of the organic EL panel 8, and the read cross-sectional image data are supplied to the EL drive transistors 60 for driving the organic EL element 62, so that the memory elements 56 and the EL drive transistor 60 can be arranged closely, whereby a wiring line through which the cross-sectional image data are supplied to the EL drive transistor 60 can be shortened. Since its wiring capacity can be made small and also its time constant can be made small, the organic EL panel 8 having a large screen in size can also provide a high-speed refresh rate, so that the three-dimensional image with a quality of a practical use level can be clearly displayed irrespective of the screen size of the organic EL panel 8.

In addition, the wiring line is long which transmits the cross-sectional image data in the large organic EL panel 8 of the usual screen size, and its time constant becomes large, so that the changeover of the display image may be slowed and the refresh rate has tendency of being slowed.

Further, for every pixel 90, all the cross-sectional image data to be displayed as the organic EL panel 8 rotates one time are temporarily stored in the memory elements 56, and then read out, while synchronizing with the rotation angle of the organic EL panel 8, so as to be displayed on the display unit 82, so that when the rotation angle of the organic EL panel 8 has the angle 1+α degrees, the cross-sectional image data after the angle 2 is also displayed at the timing to read the cross-sectional image data of the angle 1 so as to be displayed on the display unit 82, whereby the three-dimensional image to be displayed can be displayed, being shifted by an arbitrary angle (α) with respect to the regular position. For example, a three-dimensional image of a human's face en face can be shifted by 90 degrees to be displayed in profile.

Further, when the three-dimensional image data to be displayed is a still image, once the cross-sectional image data for one revolution of the organic EL panel 8 is stored in the memory elements 56 of the organic EL panel 8, then a part of circuits, such as the display gate signal-line drive circuit 88, may only be operated to display the three-dimensional image, whereby the operations of the reception means 22, the expansion unit 24, and the three-dimensional image display circuit on the base unit 4 side, etc. can be stopped, thus saving electric power.

Further, it is constructed in such a way that, for every pixel 90, all the cross-sectional image data displayed as the organic EL panel 8 rotates one time are temporarily stored in the memory elements 56, and then read out while synchronizing with the rotation angle of the organic EL panel 8, and the read cross-sectional image data are supplied to the EL drive transistors 60 for driving the organic EL elements 62, so that a write-in timing of the cross-sectional image data for the organic EL panel 8 may be performed without synchronizing with the rotation angle of the organic EL element 62, thereby easily controlling the operational timings of the compression unit 14, the transmission means 18, the reception means 22, and the expansion unit 24, and simplifying the control system.

Figure 16:
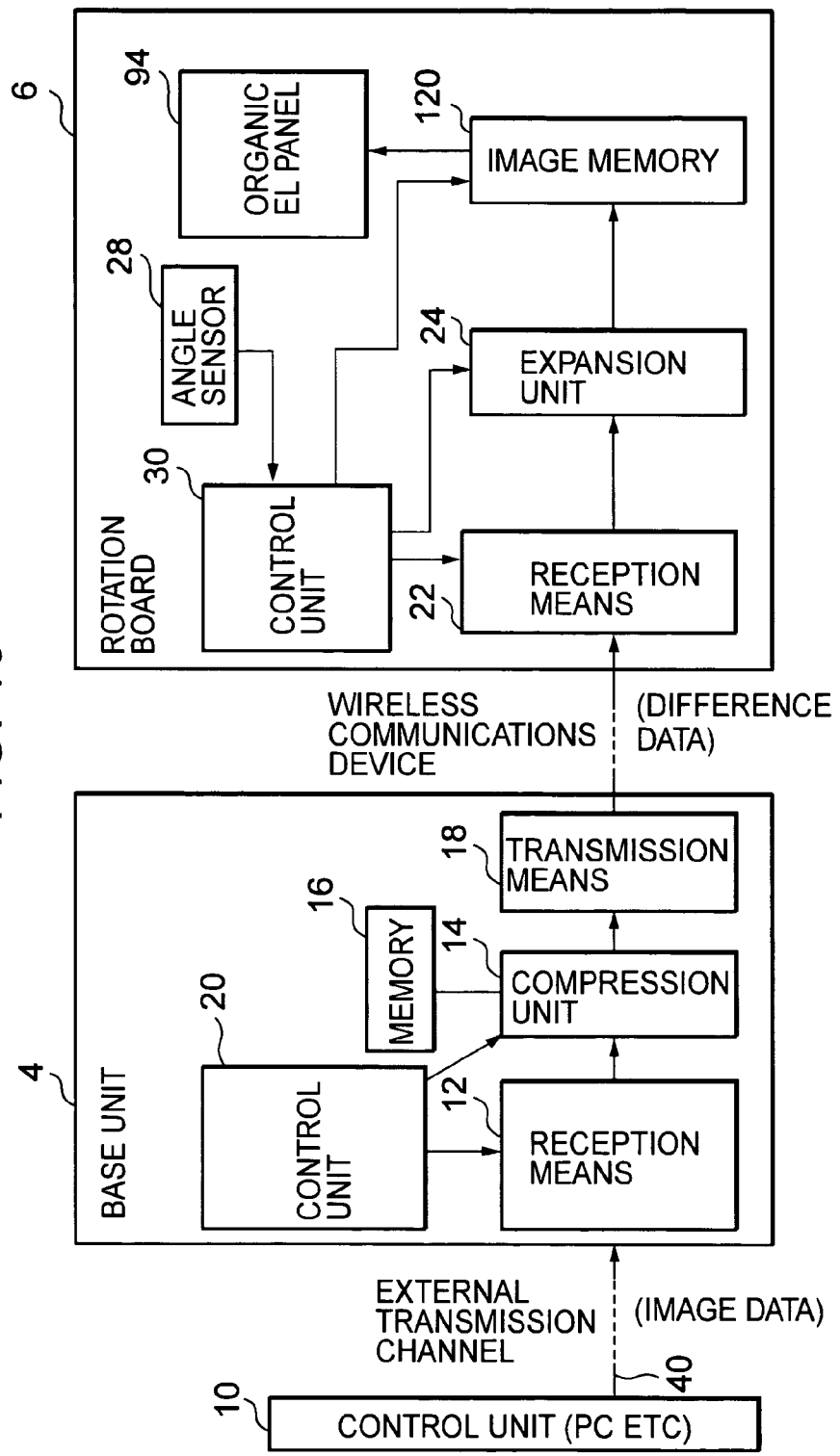
FIG. 16 is a block diagram showing the three-dimensional image display circuit of the three-dimensional image display apparatus in accordance with a second preferred embodiment of the present invention.

FIG. 16 is a block diagram showing the three-dimensional image display circuit of the three-dimensional image display apparatus in accordance with a second preferred embodiment of the present invention. However, like parts as in the first preferred embodiment are given like reference signs, and they will not be described accordingly.

The three-dimensional image display circuit of this example is also separately provided in the base unit 4 and the rotation board 6. A structure of an organic EL panel 94 set up perpendicularly on the rotation board 6 is a conventional organic EL panel which does not have a memory element inside. Accordingly, it is constructed in such a way that once the cross-sectional image data having been expanded by the expansion unit 24 and restored have been stored in an image memory 120, then they are read out while synchronizing with a rotation angle of an organic EL panel 94, so as to be inputted into the organic EL panel 94. It is constructed in such a way that read-out/write-in control of the cross-sectional image data with respect to this image memory 120 is carried out by the control unit 30. These points are different from those in the first preferred embodiment. Other structures are similar to those of the three-dimensional image display circuit of the first preferred embodiment. Further, the image memory 120 also provides a memory area at the time when the expansion unit 24 expands the compressed image data. However, in FIG. 16, the first memory means in claims is equivalent to the image memory 120, and the memory control means is equivalent to the control unit 30.

In addition, although illustration and description are omitted, the three-dimensional image display circuit for displaying the image on the organic EL panel 94, the rotating mechanism of the rotation board 6, the electric power transmission system, etc., and other structures and operations are similar to those of the first preferred embodiment.

Next, an operation of this preferred embodiment will be described. The compression unit 14 of the preferred embodiment also obtains the difference between the cross-sectional image data which is one data before and generated by the control unit 20, and the cross-sectional image data which is transmitted this time, so that the cross-sectional image data is compressed and the compressed cross-sectional image data is transmitted from the transmission means 18 to the rotation board 6 side by way of wireless communications by means of electromagnetic coupling.

The expansion unit 24 on the rotation board 6 side expands the compression image data received by the reception means 22 by using a preset area in the image memory 120, so as to restore the original cross-sectional image data. The control unit 30 writes the cross-sectional image data restored by the expansion unit 24 in the image memory 120. This image memory 120 writes in advance the cross-sectional image data for at least 2 screens of the organic EL panel 94, or for two angles or more.

At this stage, the cross-sectional image data to be displayed and the cross-sectional image data are created by the control unit 20 in order of display, then compressed and transmitted by the compression unit 14, so that the cross-sectional image data restored in the expansion unit 24 are also in order of display. Therefore, as for the image memory 120, the order of writing the cross-sectional image data which should be displayed first is the oldest.

Next, the control unit 30 synchronizes with the detection rotation angle (the rotation angle of the organic EL panel 94) of the angle sensor 28 and reads the cross-sectional image data to be displayed, corresponding to the rotation angle, and the cross-sectional image data stored earliest from the image memory 120, so as to be outputted to the organic EL panel 94 and display the cross-sectional image. It also controls writing the cross-sectional image data newly restored by the expansion unit 24 in the image memory 120, so as to adjust a lag between the restoration timing of cross-sectional image data by means of the expansion unit 24 and the display timing of the cross-sectional image data which is synchronized with the rotation angle of the organic EL panel 94.

According to the preferred embodiment, as the organic EL panel 94, the conventional one is used which does not have a memory elements. The wiring for transmitting the image data to the pixel is short and the wiring capacity is small, when the screen size is small, so that the refresh rate can be a high speed and the three-dimensional image having a quality of a practical use level similar to the first preferred embodiment can be displayed. Moreover, the organic EL panel 8 of a conventional structure is inexpensive, to thereby reduce the costs of the apparatus.

Further, similar to the first preferred embodiment, when the cross-sectional image data is wirelessly transmitted from the base unit 4 to the rotation board 6 side which rotates at a high speed revolution, the cross-sectional image data is compressed by the compression unit 14 and transmitted to the base unit 4 side, and then the compression image is expanded by the expansion unit 24 on the base unit 4 side, so as to restore the original cross-sectional image data, whereby the amount of transmitting image data per unit of time can be reduced. Therefore, the cross-sectional image data can be easily transmitted to the rotation board 6 side from the base unit 4 without delay by way of wireless communications with the usual transfer rate, or wireless communications using the electromagnetic coupling, in this example.

Further, the cross-sectional image data restored by the expansion unit 24 are temporarily held in the image memory 120, then outputted to the organic EL panel 94 while synchronizing with the rotation angle, so that it is possible to adjust the lag between the restoration timing of the above-mentioned cross-sectional image data and the display timing of cross-sectional image data. Thus, it is possible to select timings to compress, transmit wirelessly, expand the image data independently of the rotation angle of the organic EL panel 8, so that the operational timings of the compression section 14, the transmission means 18, the reception means 22, and expansion unit 24 can be controlled easily, thus simplifying the control system.

Further, when the three-dimensional image to display is a still image, once the cross-sectional image data for one revolution is held in the image memory 120, then the cross-sectional image data for one revolution may only be read from the image memory 120 so as to display the three-dimensional image, whereby operations of the three-dimensional image display circuit on the base unit 4 side, the reception means 22 on the rotation board 6 side, and the expansion means 24 can be stopped, thus saving electric power.

Figure 17:
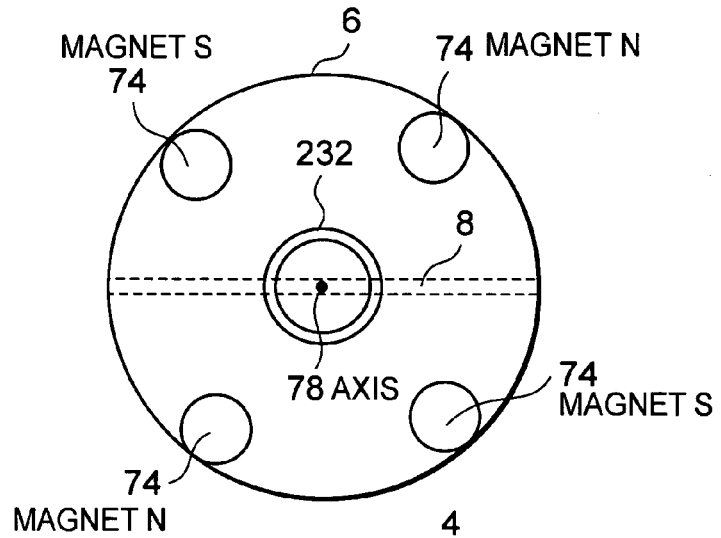
FIG. 17 is a plan view showing a structure of the back of the rotation board of the three-dimensional image display apparatus in accordance with the third preferred embodiment of the present invention.
Figure 18:
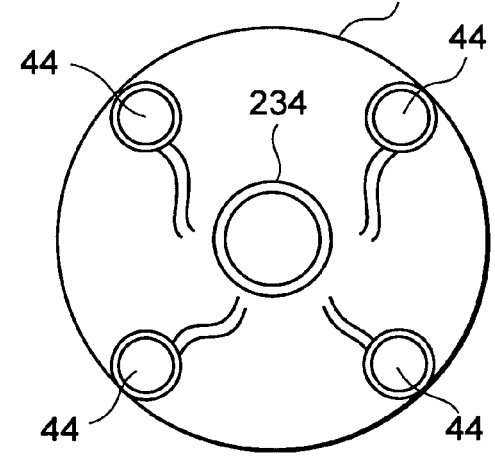
FIG. 18 is a plan view showing a structure of the upper surface of the base unit of the three-dimensional image display apparatus in accordance with the third preferred embodiment of the present invention.

FIG. 17 and FIG. 18 are plan views showing structures at the back of the rotation board of the three-dimensional image display apparatus and the upper surface of the base unit in accordance with a third preferred embodiment of the present invention. However, like parts as in the first preferred embodiment are given like reference signs and the preferred embodiment will be described.

The three-dimensional image display apparatus 2 of this preferred embodiment is also constituted by the base unit 4, the disk-shaped rotation board 6 rotatably provided on the upper surface of the base unit 4, and one sheet of rectangular organic EL panels 8 set up in the diameter direction of the rotation board 6. Its basic structure is similar to that of the first preferred embodiment. Four magnets 74 are arranged at the back of the rotation board 6 on the circumference. Four drive coils 44 are arranged on the upper surface of the base unit 4 on the circumference. However, it differs in that a circular reception coil 232 is arranged in the center of the back of the rotation board 6, a circular transmission coil 234 is arranged in the center of the upper surface of the base unit 4, and the rotating mechanism and electric power transmission system of the rotation board 6 are independent. The transmission coil in claims is equivalent to the transmission coil 234, and the transmission means is equivalent to the reception coil 232 and the transmission coil 234.

Next, an operation of this preferred embodiment will be described. When an alternating current whose current direction changes at a high speed is passed through the drive coil 44 on the upper surface of the base unit 4, the rotation board 6 rotates at a high speed revolution according to the same principle of operation as described in the first preferred embodiment, whereby the organic EL panel 8 rotates at the high speed revolution. If an alternating current is simultaneously passed through the circular transmission coil 234 on the upper surface of the base unit 4, an alternating current is induced on the reception coil 232 side, because the reception coil 232 and the transmission coil 234 are closely faced such that both coils provide magnetic coupling. After rectifying this alternating current, electric power of the voltage needed by the rotation board 6 side can be supplied through a DC/DC regulator (not shown).

According to the preferred embodiment, since the rotating mechanism and the electric power transmission system of the rotation board 6 are independent, the drive coil 44 may be designed considering only the drive function of the rotation board 6. Therefore, the optimal one can be used. Since the alternating current to be passed in the drive coil 44 may also be selected to have the optimal voltage, current, and shape, its drive efficiency can be improved.

Similarly, since the reception coil 232 and the transmission coil 234 may be designed considering only the function of the electric power transmission by using magnetic coupling, the optimal ones can be used. Since the alternating current to be passed through the transmission coil 234 can be selected to have the optimal voltage, and current, the electric power transmission efficiency can be improved.

Therefore, in this example, although the transmission of the cross-sectional image data from the base unit 4 to the rotation board 6 side is carried out by a communication means (equivalent to the communication means in claim 8) using optical communications by means of infrared rays, or short-distance wireless communications, as with the first preferred embodiment it may be transmitted by modulating, with the cross-sectional image data, the alternating current passed through the transmission coil 234 at the time of electric power transmission as described above. In that case, since the alternating current suitable for electric power transmission may only be modulated by the cross-sectional image data, there is almost no influence on electric power transmission.

Figure 19:
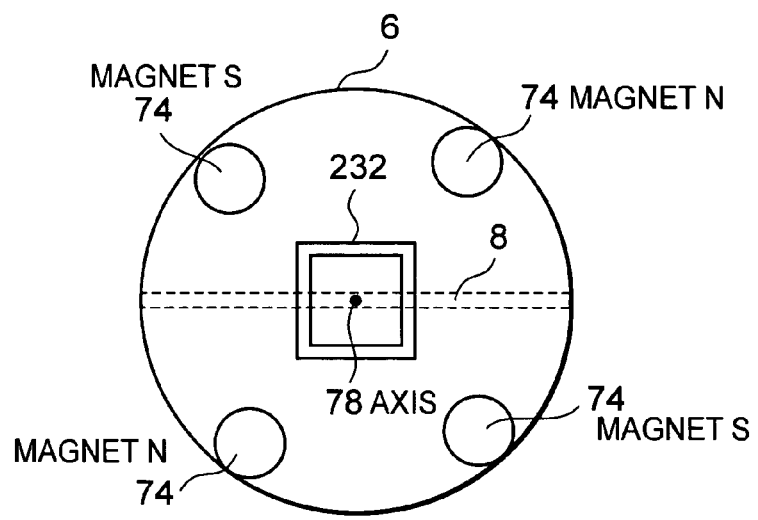
FIG. 19 a view showing another preferred embodiment of the reception coil as shown in FIG. 15.

In addition, the shape of the reception coil 232 may be a quadrangle as shown in FIG. 19. In that case, the transmission coil is also a quadrangle (not shown) and provides similar effects.

Figure 20:
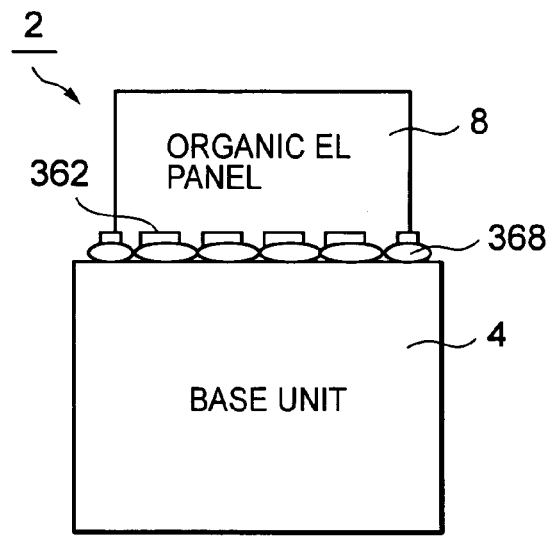
FIG. 20 is a perspective view showing an example of appearance of the three-dimensional image display apparatus in accordance with a fourth preferred embodiment of the present invention.

FIG. 20 is a perspective view showing an example of appearance of the three-dimensional image display apparatus in accordance with a fourth preferred embodiment of the present invention. However, like parts as in the first preferred embodiment are given like reference signs, and then this preferred embodiment will be described.

The three-dimensional image display apparatus 2 is constituted by the base unit 4 having the circular upper surface, the disk-shaped rotation board rotatably provided on the upper surface of this base unit 4 (not shown), and one sheet of rectangular organic EL panel 8 set up perpendicularly in the diameter direction of this rotation board. Since the diameter of the rotation board is short with respect to the diameter of the upper surface of the base unit 4, (although the rotation board does not appear in this figure) a plurality of magnets 362 are circularly arranged along with the perimeter section of the surface of this rotation board. Further, along with the perimeter section of the surface of the base unit 4, a plurality of drive coils 368 are arranged so that the plurality of magnets 362 circularly arranged may be surrounded from the outside.

Figure 21:
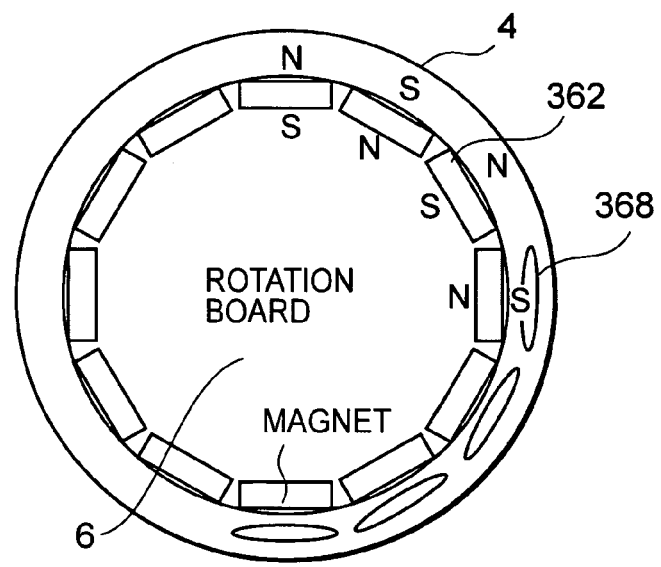
FIG. 21 is a plan view from above of the three-dimensional image display apparatus 2 as shown in FIG. 20.

FIG. 21 is a plan view from above of the three-dimensional image display apparatus 2 as shown in FIG. 20. Along with the perimeter section of the rotation board 6, the plurality of magnets 362 are arranged circularly. The plurality of drive coils 368 are arranged along the upper surface of the base unit 4 so that the plurality of magnets 362 may be surrounded from the outside. Further, the magnets 362 are arranged so that the polarities of adjacent magnets may be opposite. Furthermore, when the drive coils 368 are used as electromagnets, their winding directions are mutually reversed so that adjacent coils may have mutually reverse polarities.

Figure 22:
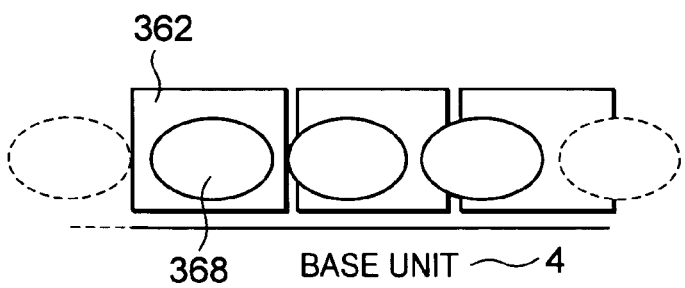
FIG. 22 is a partial side view from a side of a plurality of magnets 362 and a plurality of drive coils 368 as shown in FIG. 21.

FIG. 22 is a partial side view from a side of the above-mentioned plurality of magnets 362 and the plurality of drive coil 368. The magnets 362 are set up on the surface of the rotation board (not shown). The drive coils 368 are similarly set up on the upper surface of the base unit 4. The magnets 362 and the drive coils 368 are faced so that a predetermined gap may be provided.

Next, a rotation operation of the rotation board 6 in accordance with this preferred embodiment will be described. A current is passed through the plurality of drive coils 368 which are arranged to surround the plurality of magnets 362 from the outside, and the direction of the current is switched so that magnetic poles generated by the plurality of drive coils 368 may move for example, in the left direction of rotation. Thus, the repulsive force and the attractive force which occur among the plurality of drive coils 368 generate torque on the plurality of magnets 362 side such that the rotation board 6 may rotate in the left direction of rotation, consequently the rotation board 6 rotates.

On the other hand, we assume that, similar to the third preferred embodiment, electric power transmission is carried out by reception coils (not shown) arranged at the back of the rotation board 6 and transmission coils (not shown) arranged on the upper surface of the base unit 4 independently. Further, the transmission of the cross-sectional image data from the base unit 4 to the rotation board 6 side is performed by the communication means using the optical communications of infrared rays, or short-distance wireless communications. Similar to the second preferred embodiment, the alternating current passed through the transmission coils at the time of electric power transmission may be modulated with the cross-sectional image data then transmitted.

This preferred embodiment also provides the same effects as those of the third preferred embodiment. Since there are a lot of magnets 362 and drive coils 368 which constitute the rotating mechanism, the rotation board 6 can be rotated very smoothly.

Figure 23:
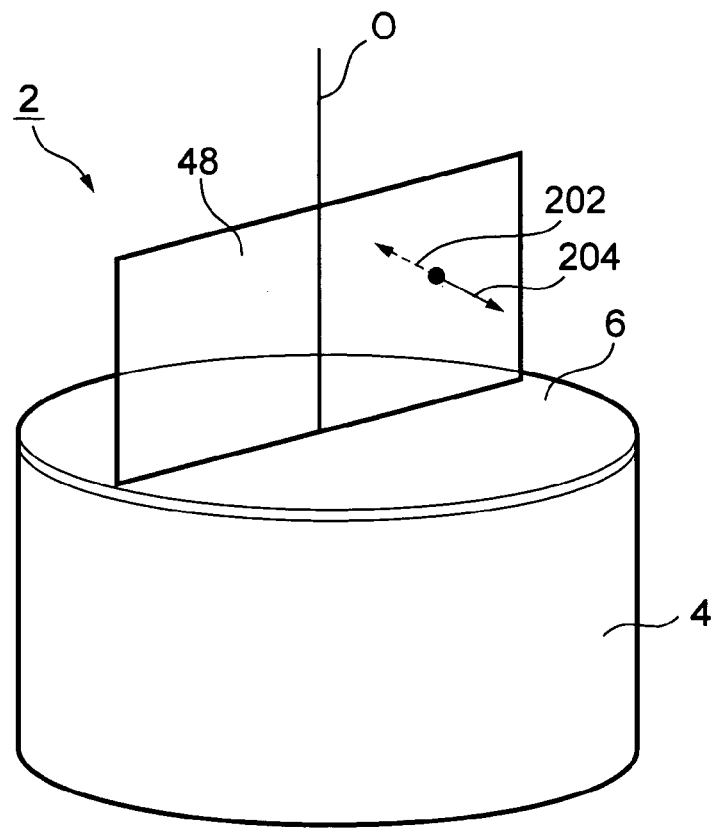
FIG. 23 is a perspective view showing an example of appearance of the three-dimensional image display apparatus in accordance with a fifth preferred embodiment of the present invention.

FIG. 23 is a perspective view showing an example of appearance of the three-dimensional image display apparatus in accordance with a fifth preferred embodiment of the present invention. However, like parts as in the first preferred embodiment are given like reference signs and then this preferred embodiment will be described.

The three-dimensional image display apparatus 2 is constituted by the cylindrical base unit 4, the disk-shaped rotation board 6 rotatably provided on the upper surface of the base unit 4, and one sheet of rectangular organic EL panel 48 set up in the diameter direction of the rotation board 6. This organic EL panel 48 is of a type that can emit light in two directions as indicated by arrows 202, 204. As the rotation board 6 rotates, the organic EL panel 48 also rotates, so that the rotation axis O corresponds to the central point of the rotation board 6. Therefore, the organic EL panel 48 of this preferred embodiment is different from that of the first preferred embodiment in that it is of a double-sided emission type. The three-dimensional image display circuit which displays the image on the organic EL panel 48, the rotating mechanism of the rotation board 6, the electric power transmission system, etc., and other structures and operations are similar to those of the first preferred embodiment.

Figure 24:
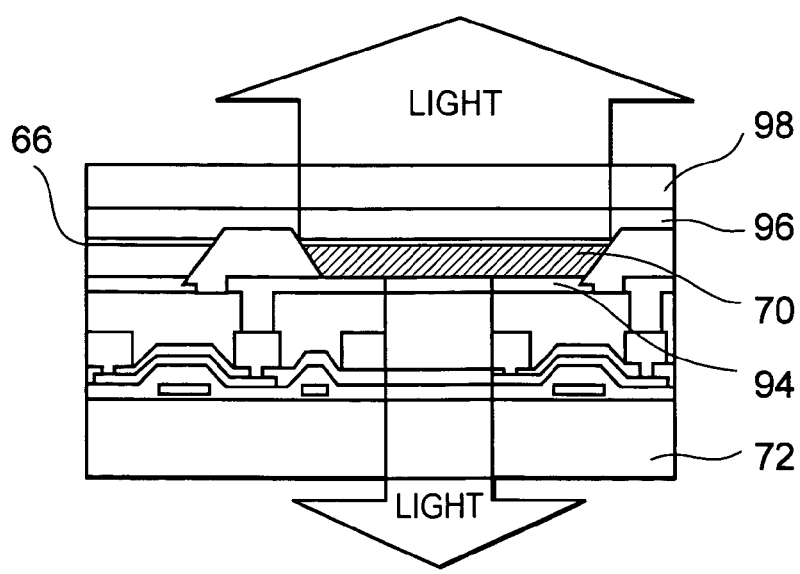
FIG. 24 is a cross-sectional view showing a structure of a pixel which constitutes the display unit of the organic EL panel 48 as shown in FIG. 23.

FIG. 24 is a cross-sectional view showing a structure of a pixel which constitutes the display unit of an organic EL panel 48. The lamination body in which the organic luminescence layer 70 is sandwiched between the light transmissive cathode 66 and the light transmissive anode 94, is formed on the glass substrate 72 so as to constitute the organic EL element. If a voltage is applied across the light transmissive cathode 66 and the light transmissive anode 94, then the organic luminescence layer 70 emits light. The light is emitted through the light transmissive cathode 66, a protection layer 96, and a transparent seal 98 as well as emitted through the light transmissive anode 94 and the glass substrate 72 to the opposite side, so that the image can be displayed on both sides of the organic EL panel 48.

Also, in this preferred embodiment, the two-dimensional cross-sectional image is displayed on the organic EL panel 48 which rotates at a high speed revolution, while synchronizing with the rotation angle, so that the three-dimensional image can be displayed clearly. In particular, since the organic EL panel 48 is of a double-sided display type, even if the number of revolutions of the organic EL panel 48 is reduced to one half of that of the first preferred embodiment, for example, the three-dimensional image of the same quality can be displayed without flickering, thereby being able to reduce the power consumption of the rotating mechanism of the rotation board 6 and facilitating its design. Further, if the number of revolutions of the organic EL panel 48 is the same as that of the first preferred embodiment, the three-dimensional object image of a higher quality with less flickering can be displayed clearly. Other effects of this preferred embodiment are similar to those of the first preferred embodiment.

Figure 25:
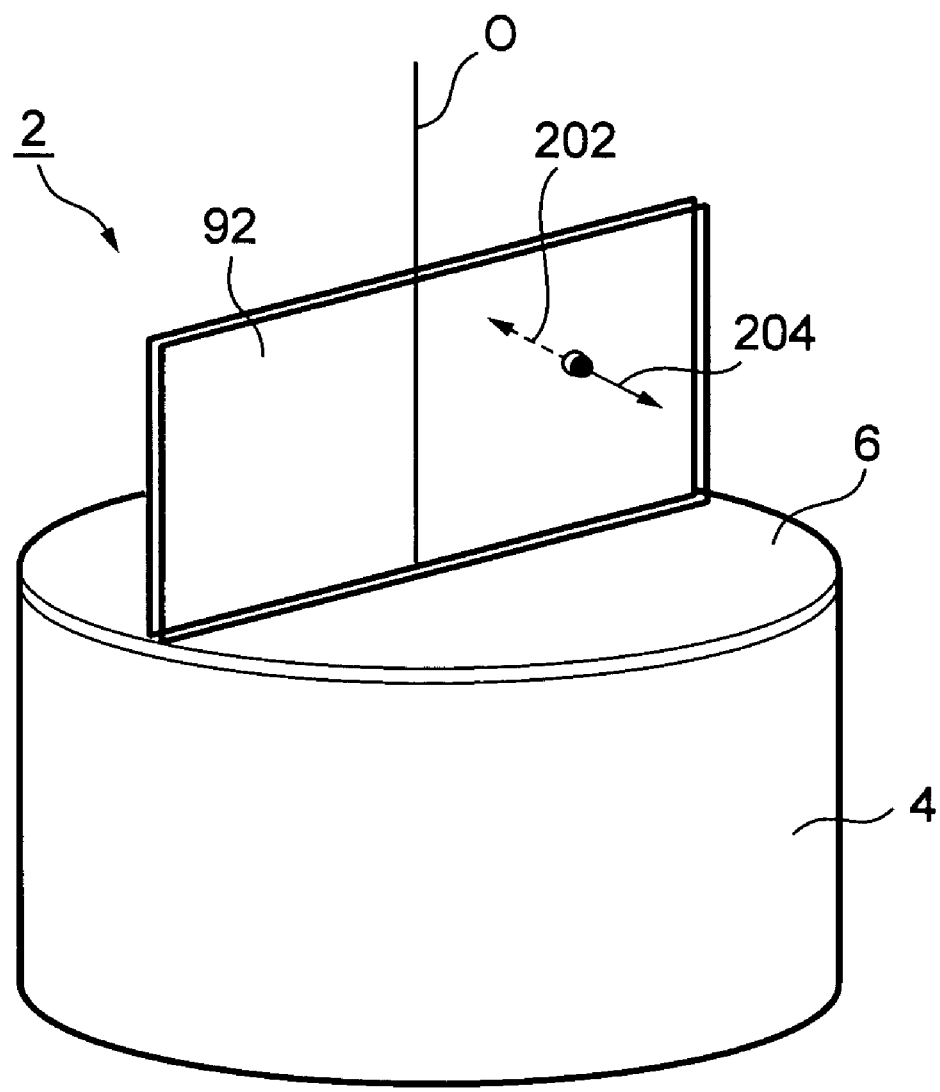
FIG. 25 is a perspective view showing an example of appearance of the three-dimensional image display apparatus in accordance with a sixth preferred embodiment of the present invention.

FIG. 25 is a perspective view showing an example of appearance of the three-dimensional image display apparatus in accordance with a sixth preferred embodiment of the present invention. However, like parts as in the first preferred embodiment are given like reference signs and then this preferred embodiment will be described.

The three-dimensional image display apparatus 2 is constituted by the cylindrical base unit 4, the rotating disk-shaped rotation board 6 provided on the upper surface of the base unit 4, and the organic EL panel 92 formed in such a manner that two sheets of organic EL panels of the single-sided emission type set up in the diameter direction of this rotation board 6 are laminated together with non-emissive surfaces into one sheet. Therefore, this organic EL panel 92 can emit light in both directions as indicated by the arrows 202, 204. As the rotation board 6 rotates, the organic EL panel 92 also rotates, so that the rotation axis O corresponds to the central point of the rotation board 6.

This preferred embodiment is different form the second preferred embodiment in that two sheets of organic EL panels are laminated together with the non-emissive surfaces into one sheet of organic EL panel 92 so as to allow the double-sided display of the organic EL panel 92. The three-dimensional image display circuit which displays the image on the organic EL panel 92, the rotating mechanism of the rotation board 6, the electric power transmission system, etc., and other structures and operations are the same as those of the first preferred embodiment.

Also, in this preferred embodiment, since the organic EL panel 92 allows the double-sided display, even if the number of revolutions of the organic EL panel 92 is reduced to one half of that of the first preferred embodiment, for example, the three-dimensional image of the same quality can be displayed without flickering, thus providing the effects similar to those of the second preferred embodiment. In particular, since the organic EL panel 92 is constructed as one panel by laminating together two sheets of organic EL panels of the single-sided emission type with non-emissive surfaces, brightness of the displayed image is not halved unlike the second preferred embodiment. Further, since the quantity of light emitted from one side is the same as that of the first preferred embodiment, even if the number of revolutions of the organic EL panel 92 is reduced, then the bright three-dimensional image without flickering can be obtained.

Figure 26:
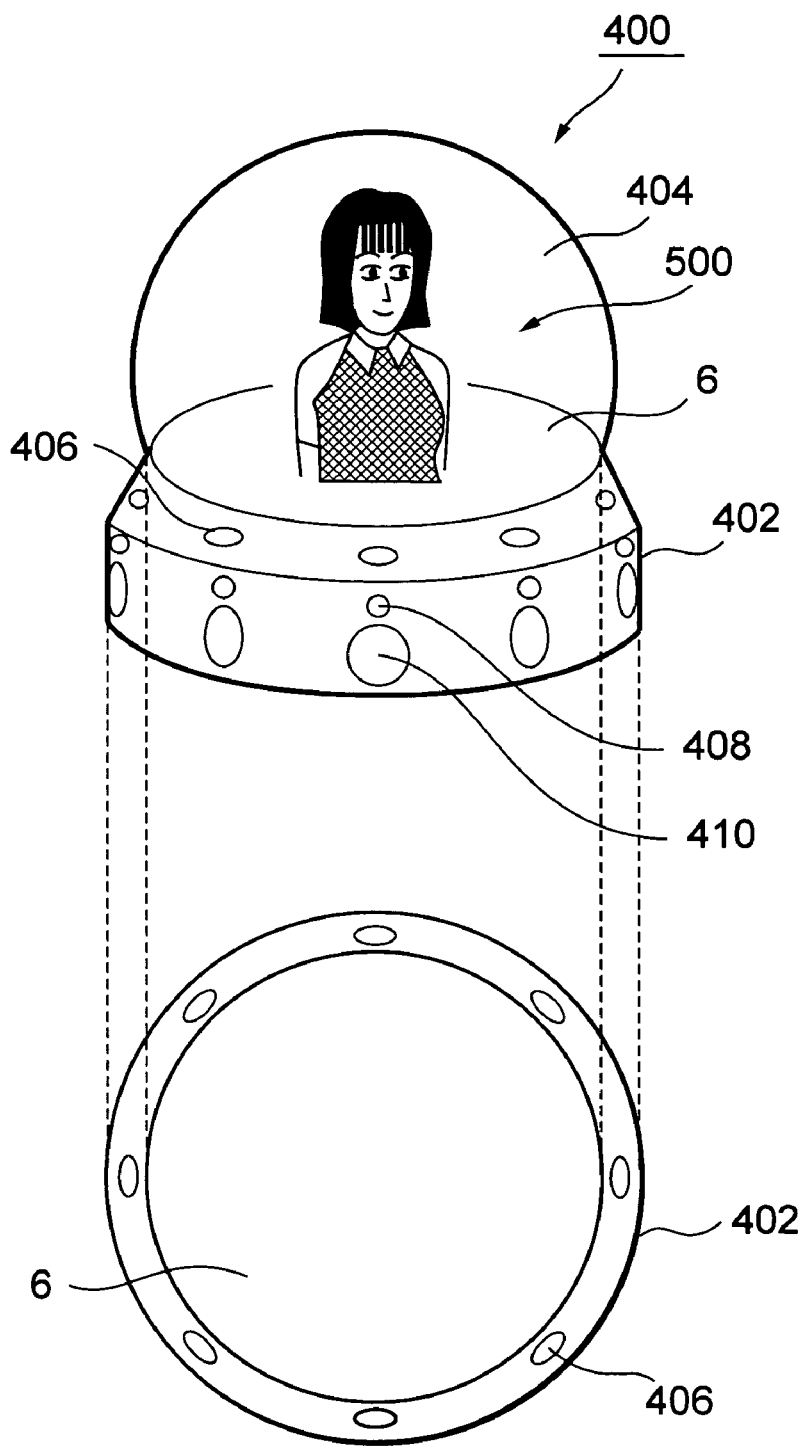
FIG. 26 is a perspective view showing an example of appearance of the three-dimensional image display apparatus in accordance with a seventh preferred embodiment of the present invention.

FIG. 26 is a perspective view and a plan view showing an example of appearance of the three-dimensional image display apparatus in accordance with a seventh preferred embodiment of the present invention. However, like parts as in the first preferred embodiment are given like reference signs, and they will not be described accordingly.

A three-dimensional image display apparatus 400 is constituted by the circular base unit 402 and the rotation board 6. A sensor (to be described later) etc. for detecting a change of an outside environment is attached to the circumference of the base unit 402. Further, a transparent windshield 404 is attached to an upper part of the base unit 402. The organic EL panel 8 as shown in FIG. 1 of the first preferred embodiment is accommodated in this windshield 404. Furthermore, in the perimeter side of the base unit 402, a plurality of video cameras 406, a plurality of directional microphones (may only be referred to as microphones) 408, a plurality of speakers 410 are arranged at regular intervals. The video cameras 406 are arranged at a tapered portion of the base unit 402, so that an image pick-up image lens (not shown) is slightly tilted upwards. In this example, the video cameras (hereafter, only referred to as cameras) 406 and the microphones 408 are the sensors for detecting the change of the outside environment. In addition, in this figure, the three-dimensional image of an upper half of the body of an electronic receptionist 500 is displayed by the three-dimensional image display apparatus. However, the image pick-up means in claims is equivalent to the video cameras 406, and a sound pickup means is equivalent to the directional microphones 408

Figure 27:
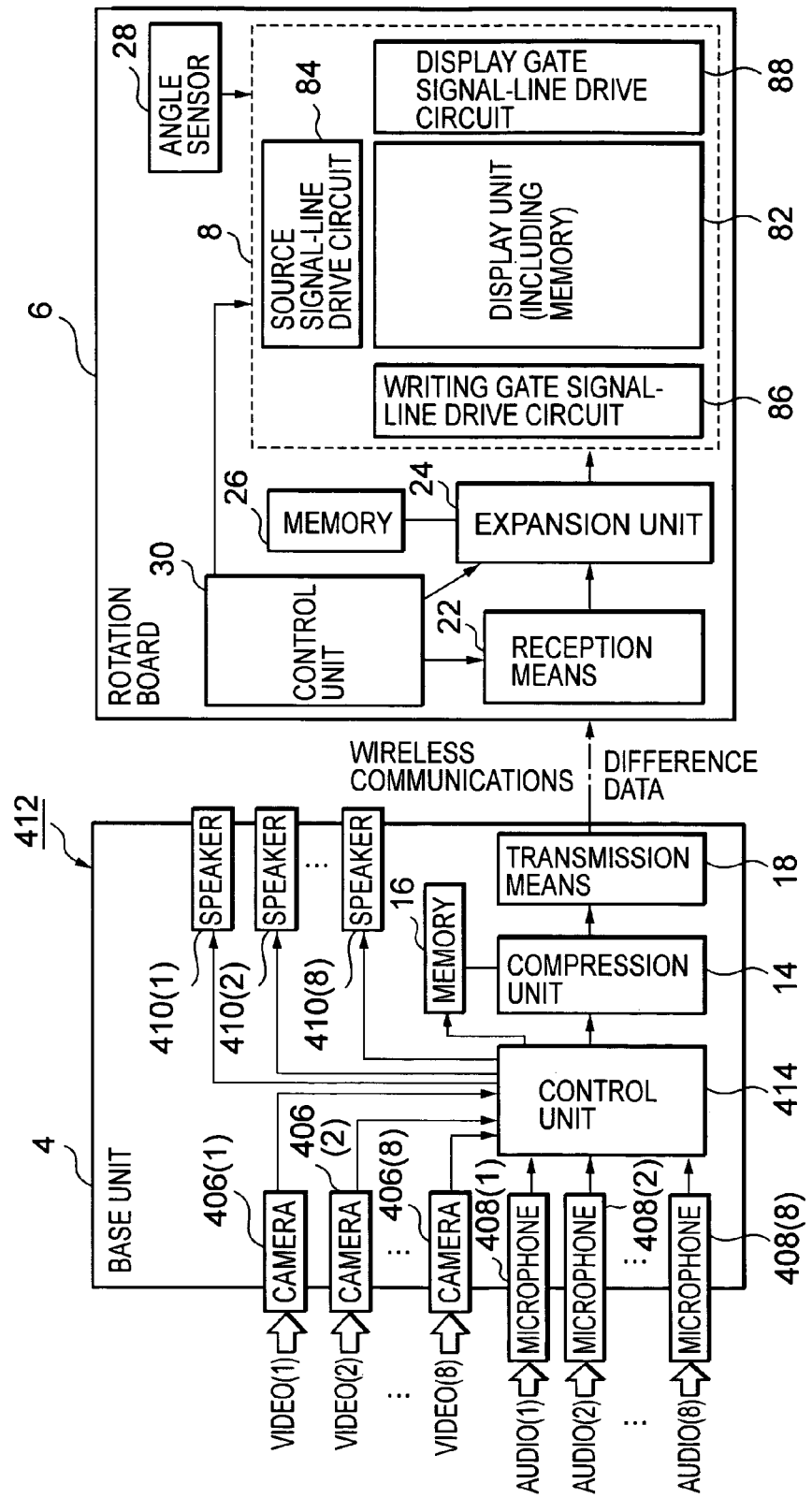
FIG. 27 is a circuit diagram showing a structure of the three-dimensional image display circuit of the three-dimensional image display apparatus 400 as shown in FIG. 26.

FIG. 27 is a circuit diagram showing a structure of a three-dimensional image display circuit of the three-dimensional image display apparatus 400 of FIG. 26. The structure of the three-dimensional image display circuit 412 of this preferred embodiment is separately provided in the base unit 402 and the rotation board 6 side, and is similar to that of the first preferred embodiment. Since the structure on the base unit 402 side differs from that of the first preferred embodiment, only the structure of the base unit 402 will be described hereafter.

The base unit 402 side comprises the compression unit 14 for compressing the image data, the memory 16 which provides the operational area for the compression unit 14, the transmission means 18 for transmitting the compressed image data to the rotation board 6 side, the control unit 414 for processing the external data collected by the cameras 406 or the microphones 408, eight cameras 406(1) to 406(8) for imaging the circumference of the apparatus and inputting the image information into the control unit 414, eight microphones 408(1) to 416(8) for picking up sound around the apparatus and inputting the sound into the control unit 414, and eight speakers 410 to 410(8) for outputting a voice response of the electronic receptionist 500, guidance information, etc. In addition, the circuit on the rotation board 6 side is similar to that of the first preferred embodiment, and its description will not be repeated.

As described above, the three-dimensional image display apparatus of this preferred embodiment three-dimensionally displays the image of the electronic receptionist (animation) 500 and has the electronic receptionist function. Therefore, eight cameras 406 and eight directional microphones 408 are attached equally to the circumference of the three-dimensional image display apparatus so as to take in the image and the sound in the 360 degree directions around the circumferences. According to the input of the image and the sound, the electronic receptionist 500 of the three-dimensional image responds. Further, eight speakers 410 are also mounted which output the sound according to an operation and the direction of the electronic receptionist 500 displayed three-dimensionally.

Figure 28:
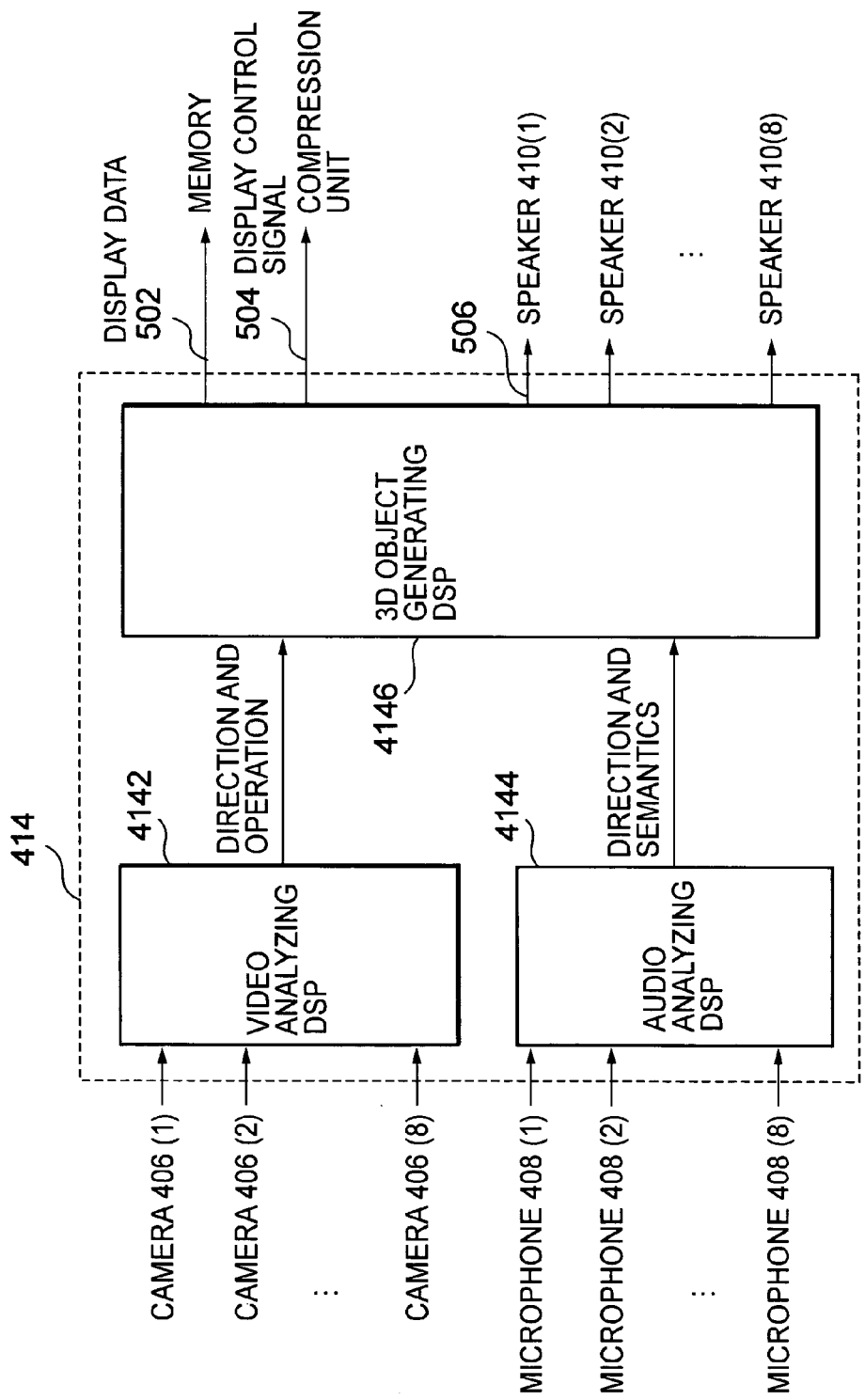
FIG. 28 is a block diagram showing a structure of the control unit 414 as shown in FIG. 27.

FIG. 28 is a block diagram showing a structure of the control unit 414 as shown in FIG. 27. The control unit 414 comprises a video analyzing DSP 4142 for inputting and analyzing the image data from the cameras 406, an audio analyzing DSP 4144 for analyzing an audio data from the microphones 408, and a 3D object generating DSP 4146 for generating a display data 502, a display control signal 504, and an audio signal 506, based on the resulting analysis of the video analyzing DSP 4142 and the audio analyzing DSP 4144.

Next, an operation of this preferred embodiment will be described. The three-dimensional image display apparatus 400 has the electronic receptionist function, such as displaying the three-dimensional electronic receptionist 500, guidance at a reception desk a company or a building, a front desk of a hotel, a police box (may be used during a patrol and absence, or for an uninhabited police box, etc.), etc., and is an apparatus for guiding a visitor. In order to realize the above-mentioned electronic receptionist function, the control unit 414 performs processes according to the flow charts of FIG. 29, FIG. 30, and FIG. 31.

Figure 29:
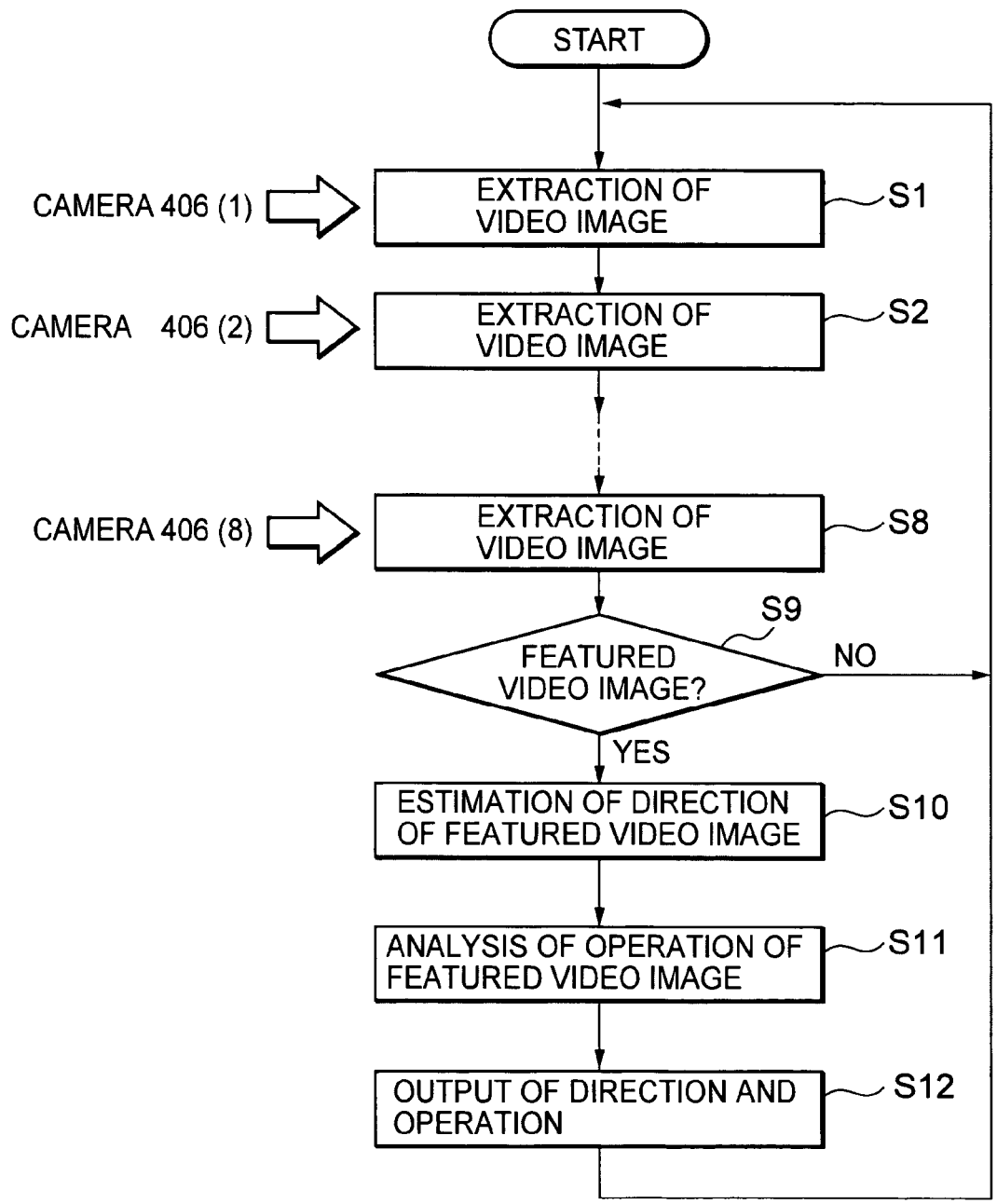
FIG. 29 is a flow chart showing a flow of image data processing of a video analyzing DSP as shown in FIG. 28.

FIG. 29 is a flow chart showing a flow where the control unit 414 processes the inputted image data. Firstly, the video analyzing DSP 4142 of the control unit 414 extracts a feature image, such as a person, from the image data inputted from the camera 406(1) in step S1, then extracts a feature image from the image data inputted from the camera 406(2) in step S2, and so on. Feature images are similarly extracted from the image data inputted from the cameras 406(3) to 406(8) in steps S3 to S8. In other words, in steps S1 to S8, the image data are inputted from eight cameras 406, and the feature images are extracted. Next, the video analyzing DSP 4142 determines in step S9 whether or not the feature image is extracted from the image data of one or more cameras, among the image data from the camera 406(1) to the camera 406(8). When it is not extracted, the process returns to the process in step S1. When it is extracted, the process goes to the process in step S10.

In step S10, the video analyzing DSP 4142 estimates a direction in which a feature image is found based on a spatial relationship and exposure to light for each feature image. Next, in step S11, after synthesizing a plurality of feature images based on the direction in which the feature image is found, it analyzes an operation of the feature image. During this analysis of the operation, it is determined whether the feature image is approaching or going off, or whether it is stationary. After that, in step S12, the video analyzing DSP 4142 outputs information about the operation and the direction in which the feature image is found, to the 3D object generating DSP 4146, then the process returns to the process in step S1. In addition, if a power supply, for example, is turned off and the apparatus is stopped, then the video analyzing DSP 4142 causes the process to exit from the loop of the processing flow of FIG. 29, and terminates the process.

Figure 30:
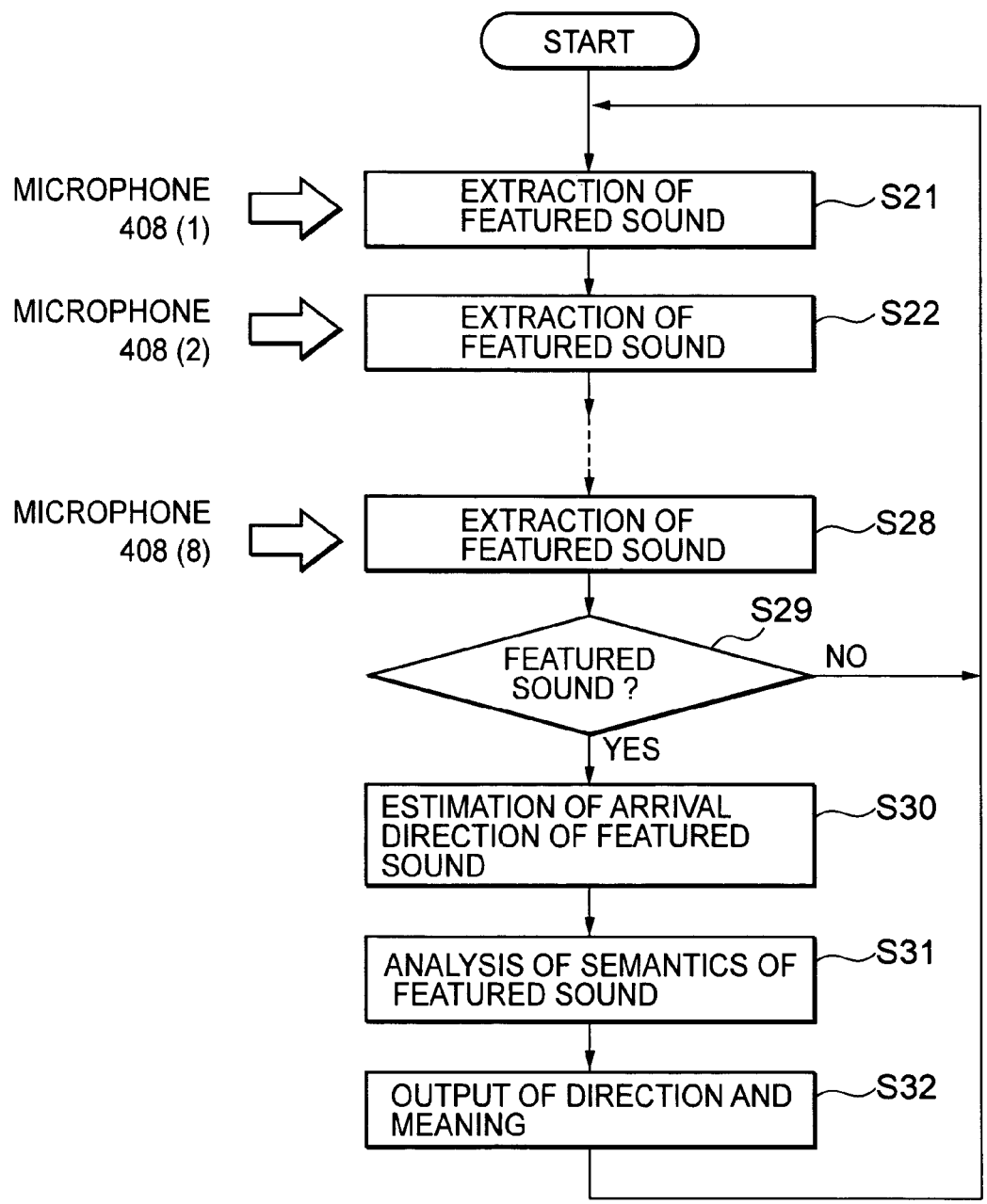
FIG. 30 is a flow chart showing a flow of audio data processing of an audio analyzing DSP as shown in FIG. 29.

FIG. 30 is a flow chart showing a flow in which the audio analyzing DSP 4144 processes an inputted audio data. Firstly, the audio analyzing DSP 4144 extracts feature sound, such as footfalls, voice, etc. of a person, from the audio data inputted through the microphone 408(1) in step S21. The feature sound is extracted from the audio data inputted through the microphone 408(2) in step S22, and so on. The feature sound is similarly extracted from the audio data inputted through the microphones 408(3) to 408(8) in steps S23 to S28. In other words, the feature sound of the audio data inputted in steps S21 to S28 through eight microphones 408 is each extracted. Next, in step S29 the audio analyzing DSP 4144 determines whether or not the feature sound is extracted from the audio data of one or more sets of microphones 408, among the audio data of the microphone 408(1) to the microphone 408(8). When it is not extracted, the process returns to the process in step S21. When it is extracted, the process moves to step S30.

In step S30, the audio analyzing DSP 4144 estimates an arrival direction of the extracted feature sound by using magnitude of sound volume of the audio data inputted through each microphone 408, for example. In step S31, when the feature sound is a word, its meaning is analyzed. For example, it is analyzed to see whether a desired place to go is searched for or whether a name of a person to meet is searched for. Next, in step S32, the audio analyzing DSP 4144 outputs the arrival directions of the obtained feature sound and the semantic information, when spoken, to the 3D object generating DSP 4146, then the process returns to the process in step S21. In addition, if the power supply etc. is turned off and the apparatus is stopped, then the audio analyzing DSP 4144 causes the process to exit from the loop of the processing flow of FIG. 14, and terminates the process.

Figure 31:
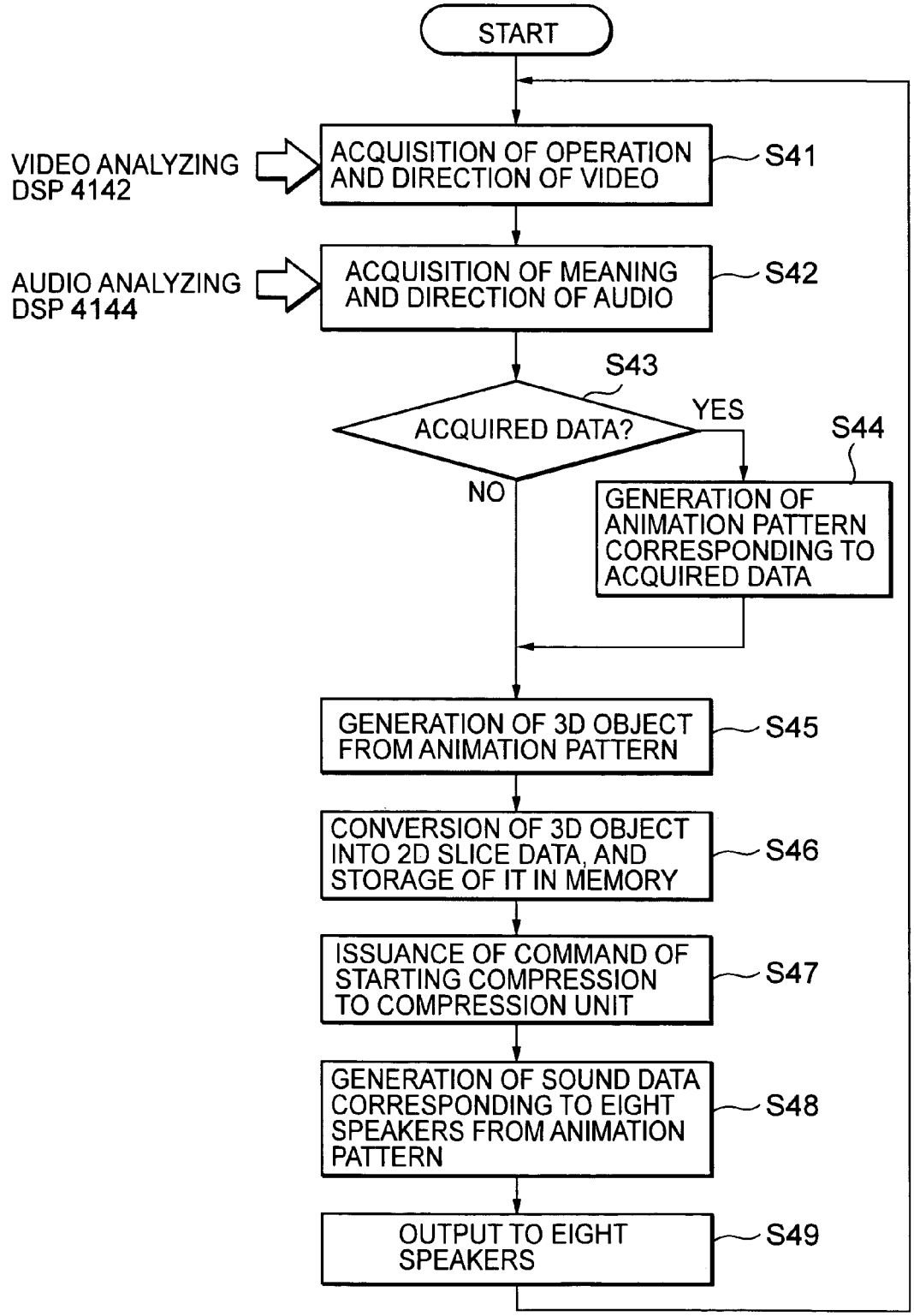
FIG. 31 is a flow chart showing a flow of creation processing of a display control signal and an audio signal of an image and audio data of a 3D object generating DSP as shown in FIG. 30.
Figure 32:
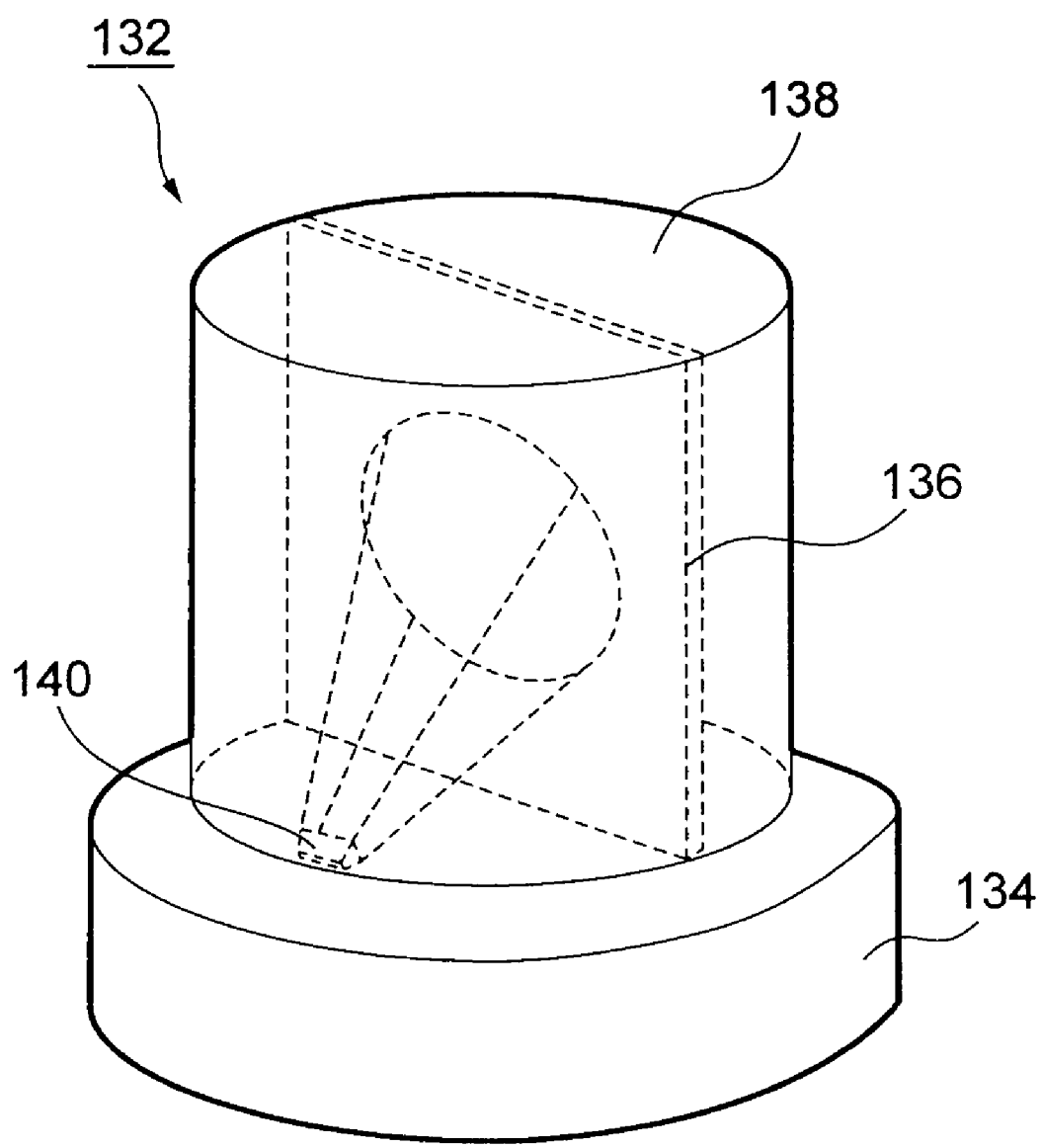
FIG. 32 is a view showing a schematic structure of a conventional volumetric scan type three-dimensional display unit.

FIG. 31 is a flow chart showing a flow in which the control unit 414 generates the display data 502, the display control signal 504, and the audio signal 506, based on resulting analysis of the video image and audio data. In step S41 the 3D object generating DSP 4146 of the control unit 414 acquires the information about the operation and the direction of the feature image, which is inputted from the video analyzing DSP 4142. Next, in step S42 the 3D object generating DSP 4146 acquires the semantic information and the arrival directions of the feature sound inputted from the audio analyzing DSP 4144, and determines whether or not there is any acquisition data in step S43. When there is an acquisition data, the process goes to step S44. When there is no acquisition data, the process goes to step S45.

When the 3D object generating DSP 4146 moves to step S44, an animation pattern corresponding to the acquisition data is generated. For example, when the feature image is a visitor who approaches and comes to the front, an animation pattern which greets the visitor with a smile is generated, then the process goes to step S45. In step S45, a 3D object is generated from the generated animation pattern, where the 3D object is the upper half of the body of electronic receptionist 500. On the other hand, when there is no acquisition data and the process directly moves to step S45, then a 3D object is generated from the existing animation pattern, and the process goes to step S46.

In step S46 the 3D object generating DSP 4146 converts the generated 3D object into the two-dimensional cross-sectional image data, as shown in the first preferred embodiment. After storing the data in memory 16, in step S47 the compression unit 14 is issued with instructions to start compressing the above-mentioned two-dimensional cross-sectional image data. Further, in step S48 the 3D object generating DSP 4146 generates the audio data according to the above-mentioned animation pattern. The audio data to be generated become the audio data of eight channels outputted from respective speakers 410(1) to 410(8). In step S49, after outputting the sound according to these audio data from the corresponding speakers 410(1) to 410(8), the process returns to the process in step S41.

Now, if the above-mentioned animation pattern is the electronic receptionist 500 who greets and waits on the visitor, then the 3D object generating DSP 4146 generates the audio data such that the electronic receptionist 500 greets and waits on the visitor, which is suitable in this case. Further, when the voice is outputted from the eight speakers 410(1) to 410(8), the voice becomes the audio data of eight channels corresponding to the eight speakers so that audio pressure may become high in the direction of the visitor. In addition, if the power supply etc. is turned off and the apparatus is stopped, then the 3D object generating DSP 4146 causes the process to exit from the loop of the processing flow of FIG. 31, and terminates the process.

In the above-mentioned process of the control unit 414, for example, when the electronic receptionist 500 is called from behind, it is determined that it is called from behind according to the image data of the camera 406 at the back and the audio data of the microphones 408 at the back. Thus, the animation is created in which the electronic receptionist 500 turns around and greets the visitor. After the electronic receptionist 500 turns around, the audio data is created to output a greeting voice (word) from the speaker 410 in the back. Thus, when the electronic receptionist 500 is turned around, the 3D object generating DSP 4146 uses the existing animation so as to create the control signal for rotating its display position, and transmits it to the control unit 30 on the rotation board side through the compression unit 14, the transmission means 22, and the reception means 22. Thus, similar to the first preferred embodiment, the control unit 30 rotates the display position of the electronic receptionist 500 displayed three-dimensionally, and performs control of turning it around, for example.

Assuming that after the electronic receptionist 500 turns around and the visitor approaches, the visitor is imaged by the cameras 406 and the sound, such as the visitor's footfalls or the visitor's voice, is picked up by the microphones 408. The image data imaged and obtained by the cameras 406 and the audio data picked up and obtained by the microphones 408 are inputted into the control unit 414 of the base unit 402. Based on these information data, the control is performed such that the electronic receptionist 500 suitably waits on the visitor.

According to this preferred embodiment, the organic EL panel 8 having built-in memory elements is used, so that the electronic receptionist 500 which is lifelike in size can be displayed clearly and three-dimensionally and this electronic receptionist 500 can be employed as an interface with the visitor. Therefore, the visitor can contact it with the feeling similar to that of a real receptionist, and receive a friendly impression. Since it is not necessary to perform a reception operation, the visitor can save time, thus realizing the electronic reception function which is very useful. Further, for example, when using it in an environment where light comes in if a door is opened, the electric reception function can be used in such a way that the electronic receptionist 500 turns to the direction, detecting that the door is opened as the light comes in. Further it is possible to respond to a request of the visitor in the 360 degree directions. For example, even when a plurality of visitors come at the same time, the electronic receptionist 500 may turn to the visitor on whom it waits first, then it is possible to naturally show who it is going to communicate with.

In addition, if a plurality of odor sensors are attached to the circumference of the base unit 402 of the above-mentioned preferred embodiment, it is also possible to provide a warning "NO SMOKING HERE" when a smell of tobacco is detected in a nonsmoking area, for example.

In addition, the present invention is not limited to the above-mentioned preferred embodiments, and may be implemented by other various preferred embodiments without departing from the feature and scope of the invention in terms of particular structures, function, operations, effects.

For example, as shown in FIG. 3 to FIG. 7, the organic EL panel 8 of the preferred embodiment is arranged to temporarily stores the cross-sectional image data in the memory elements 56 for each pixel 90, so as to be read synchronizing with the rotation angle of the organic EL panel 8, and supply the read cross-sectional image data to the EL drive transistor 60 which drives the organic EL element 62. The wiring line through which the cross-sectional image data is supplied to the EL drive transistor 60 is shortened to make the time constant of the wiring small, so that the organic EL panel having the large-sized screen may allow its refresh rate to be at a high speed so as to display the three-dimensional image. However, when the screen size of the organic EL panel 8 is small, the wiring is short, so that the conventional structure without the above-mentioned memory elements can also cause the refresh rate to be at a high speed. Therefore, even if a panel of a conventional structure having no memory elements is used as the organic EL panel 8, the three-dimensional image can be displayed. Moreover the organic EL panel 8 of the conventional structure is inexpensive, to thereby reduce the costs of the apparatus. However, in this case, as an example, between the expansion unit 24 and organic EL panels 8 of FIG. 2, a timing control circuit needs to be provided which supplies the two-dimensional cross-sectional image data to the organic EL panel 8 at the timing synchronizing with the rotation angle of the organic EL panel 8.

For example, the above-mentioned preferred embodiments have structures in which the plurality of magnets 74 and the plurality of reception coils 76 are arranged on the rotation board 6 side, and a rotation drive mechanism is provided which arranges a plurality of drive coils 44 on the base unit 4 side, so as to wirelessly transmit the electric power and the image data by means of electromagnetic coupling of the reception coil 76 and the drive coil 44. However, the rotation board 6 may conventionally be rotated by a motor etc. so as to use the electromagnetic coupling for wirelessly transmitting the electric power and the image data from the base unit 4 side to the rotation board 6 side. Alternatively the electric power may be wirelessly transmitted by means of electromagnetic coupling, and the image data may be transmitted by conventional wireless-communications systems, such as optical communications and short-distance wireless communications.

Further, in the above-mentioned preferred embodiments, although the organic EL panel 8 employs one that is of the single-sided emission, one sheet of organic EL panel being of the double-sided emission, or one sheet of organic EL panel which is obtained by laminating together two sheets of organic EL panels being of the single-sided emission with the non-emissive surface so as to be considered as the double-sided emission, may be used, so that it is possible to display the three-dimensional image of the same quality without flickering, even if the number of revolutions of the organic EL panel is reduced to one half of that of the above-mentioned preferred embodiment, to thereby reduce the power consumption of the rotating mechanism of the rotation board 6 and simplify its design. In particular, one sheet of panel obtained by laminating together two sheets of the organic EL panels may not halve the brightness of the display image unlike one sheet of organic EL panel allowing the double-sided emission. Since the quantity of light emitted from one side is the same, even if the number of revolutions of the organic EL panel is reduced, then the bright three-dimensional image can be obtained without flickering. Further, as the organic EL panel of the conventional structure, a type that does not integrally form therein a drive circuit for driving a pixel may be used.

Further, in the above-mentioned preferred embodiments, the memory elements 56 included within the organic EL panel 8 are of a type which stores 1-bit image data, and therefore the image displayed by the organic EL panel 8 is described assuming that it is a monochrome image. However, the storage capacity of the memory elements 56 may be of multi-bits, and the image data sent through the source signal line 52 may be subjected to A/D conversion, then stored in the memory elements 56, to thereby colorize the display image. The storage capacity of the memory elements 56 may be of 3 bits, for example, so that eight colors can be displayed.

Further, when the image data to be stored in the memory elements 56 is similar to the image data already stored, which is one data before, and there are a lot of common portions, only the difference data between these image data may be stored in the above-mentioned memory elements 56, so that an amount of rewriting of the image data can be reduced, to thereby reduce the power consumption needed for the rewriting.

Further, in the above-mentioned preferred embodiments, the present invention is applied to the system for switching and displaying the image on the rotating self-luminous two-dimensional display device, while synchronizing with the rotation angle. However, the present invention may also be applied to an apparatus for displaying the three-dimensional image in which the two-dimensional display device moves at a high speed, by means of the system for displaying the two-dimensional cross-sectional image on the above-mentioned two-dimensional display device while synchronizing with the moved distance, so that the two-dimensional display device which moves at a high speed may be the organic EL panel, thus displaying the three-dimensional image of a practical level.

Furthermore, in the above-mentioned preferred embodiments, although the control unit 10 is arranged to be connected through the external communication channel 40 to the base unit 4 side of the three-dimensional image display circuit, a device to be connected may be any image device which can input the difference data with respect to changes of three-dimensional object image data over time, such as a receiver, an optical disk playback device, etc.

What is claimed is:

1. A three-dimensional image display apparatus configured to display a three-dimensional image as a set of two-dimensional images by switching and displaying two-dimensional images on a rotating self-luminous two-dimensional display panel while synchronizing with a rotation angle of the two-dimensional display panel, said three-dimensional image display apparatus comprising:
    a rotation body for rotating the two-dimensional display panel while fixing and supporting the two-dimensional display panel, said rotation body includes
        first storage means for storing at least two screen images of restored image data,
        a plurality of magnets, and
        storage control means for reading a first screen image of the restored image data stored in the first storage means while synchronizing with the rotation angle of the two-dimensional display panel, inputting thus read out first screen image of restored image data to be displayed to the two-dimensional display panel, and storing newly restored second screen image of restored image data to said first storage means;
    a support body for rotatably supporting the rotation body, the support body is external to said rotation body, and includes a plurality of drive coils which generate a repulsive and an attractive force with the plurality of magnets in the rotation body;
    a compression unit mounted on the support body configured to compress image data to display the two-dimensional image on the two-dimensional display panel;
    a transmission unit mounted on the support body configured to transmit the compressed image data to the rotation body;
    a reception unit mounted on the rotation body configured to receive the transmitted compression image data; and
    an expansion unit mounted on the rotation body configured to expand the received compression image data so as to restore the original image data.

2. The three-dimensional image display apparatus of claim 1, wherein said self-luminous two-dimensional display panel is an organic EL panel.

3. The three-dimensional image display apparatus of claim 2, wherein said organic EL panel is a double-sided emission type.

4. The three-dimensional image display apparatus of claim 2, wherein said organic EL panel is formed by laminating two sheets of organic EL panels of single-sided emission type together with their non-emissive surfaces.

5. The three-dimensional image display apparatus of claim 2, wherein said two-dimensional image display panel includes storage means for temporarily storing the two-dimensional image.

6. The three-dimensional image display apparatus of claim 1, wherein said transmission unit transmits the compressed image data to said reception unit wirelessly.

7. The three-dimensional image display apparatus of claim 1, wherein
    said compression unit compresses the image data by obtaining difference image data of adjoining image data to be displayed on the two-dimensional display panel; and
    said expansion unit restores the image data to be displayed on the two-dimensional display panel from the previously restored image data and currently received difference image data.

8. The three-dimensional image display apparatus of claim 1, wherein said self-luminous two-dimensional display panel includes second storage means for storing restored image data corresponding to one rotation of the two-dimensional display panel while synchronizing with the rotation angle thereof corresponding to all pixels constituting the two-dimensional display panel, and displays the image by turning on and off said pixels by utilizing image data read out from said second storage means in synchronism with the rotation angle.

9. The three-dimensional image display apparatus of claim 1, wherein
said two-dimensional display panel includes:
storage means for storing image data of the two-dimensional image; and
display means for reading the image data stored in the storage means while synchronizing with the rotation angle of the two-dimensional display panel, and displaying two-dimensional image corresponding to the read out image data.

10. The three-dimensional image display apparatus of claim 9, wherein
said storage means includes storage elements constructing the display means for storing image data for all pixels.

11. The three-dimensional image display apparatus of claim 9, wherein
said storage means includes N storage elements, provided that an angular resolution of the three-dimensional image is N; and
said display means selects storage elements to read out the image data by each 360 degrees/N rotation of the two-dimensional display panel.

12. The three-dimensional image display apparatus of claim 1, further includes display shift control means for shifting display position of the three-dimensional image.

13. The three-dimensional image display apparatus of claim 12, wherein said display shift control means shifts timings for displaying on said display means the image corresponding to the image data read out from said storage means in synchronism with the rotation angle of the two-dimensional display panel by 360 degrees/N.

14. The three-dimensional image display apparatus of claim 1, wherein electric power is transmitted from said support body to said rotation body wirelessly.

15. A three-dimensional image display apparatus configured to display a three-dimensional image as a set of two-dimensional images by switching and displaying the two-dimensional images on a rotating body including a sheet of rotating self-luminous two-dimensional display panel while synchronizing with a rotation angle of the two-dimensional display panel, said three-dimensional image display apparatus comprising:
memory means for storing restored image data of the two-dimensional image displayed on the two-dimensional display panel, said memory means is included in said rotating sheet and stores at least two screen images of restored image data;
display means for reading the restored image data from the memory means while synchronizing with the rotation angle of the two-dimensional display panel so as to display the two-dimensional image corresponding to the read image data on the display unit of the two-dimensional display panel;
input means for inputting external information;
compression means for compressing original image data to display the two-dimensional image on the two-dimensional display panel;
display shift control means for changing a timing to read the restored image data from the memory means according to the inputted external information, and shifting a display position of the three-dimensional image in the direction of rotation of the two-dimensional display panel, or in the reverse direction thereto;
expansion means, mounted on the rotating body, for expanding the received compression image data so as to restore an original image data; and
a plurality of magnets in the rotating body, and a support body which supports the rotating body is external to said rotating body and includes a plurality of drive coils which generate a repulsive and an attractive force with the plurality of magnets in the rotating body.

* * * * *